United States Patent
Webster et al.

(10) Patent No.: US 12,092,579 B2
(45) Date of Patent: *Sep. 17, 2024

(54) INTEGRATED SENSOR WITH REDUCED SKEW

(71) Applicant: Quantum-Si Incorporated, Branford, CT (US)

(72) Inventors: Eric A. G. Webster, Santa Clara, CA (US); Dajiang Yang, San Jose, CA (US); Xin Wang, San Jose, CA (US); Zhaoyu He, Milpitas, CA (US); Changhoon Choi, Palo Alto, CA (US); Peter J. Lim, Saratoga, CA (US); Todd Rearick, Cheshire, CT (US)

(73) Assignee: Quantum-Si Incorporated, Branford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/093,213

(22) Filed: Jan. 4, 2023

(65) Prior Publication Data

US 2023/0152229 A1    May 18, 2023

Related U.S. Application Data

(63) Continuation of application No. 17/224,899, filed on Apr. 7, 2021, now Pat. No. 11,573,180.

(Continued)

(51) Int. Cl.
| | |
|---|---|
| *G01N 21/64* | (2006.01) |
| *G05F 1/46* | (2006.01) |
| *H01L 27/146* | (2006.01) |

(52) U.S. Cl.
CPC ..... *G01N 21/6456* (2013.01); *G01N 21/6408* (2013.01); *G01N 21/6454* (2013.01);
(Continued)

(58) Field of Classification Search
CPC .................... H01L 27/14616; H01L 27/14643
See application file for complete search history.

(56) References Cited

U.S. PATENT DOCUMENTS

| | | | |
|---|---|---|---|
| 5,961,924 | A  | 10/1999 | Reichert et al. |
| 6,686,582 | B1 | 2/2004  | Volcker et al. |
| | | (Continued) | |

FOREIGN PATENT DOCUMENTS

| | | | |
|---|---|---|---|
| EP | 2182523 A1 | 5/2010 |
| EP | 2487897 A1 | 8/2012 |
| | (Continued) | |

OTHER PUBLICATIONS

Extended European Search Report for European Application No. 18202357.2 dated Mar. 15, 2019.

(Continued)

*Primary Examiner* — Thanh Luu
(74) *Attorney, Agent, or Firm* — Wolf, Greenfield & Sacks, P.C.

(57) ABSTRACT

Aspects of the present disclosure relate to techniques for reducing skew in an integrated device, such as a CMOS imaging device. In some aspects, multiple pixels of an integrated circuit may be configured to receive a same control signal and conduct charge carriers responsive to the control signal substantially at the same time. In some aspects, an integrated circuit may have modulated charge transfer channel voltage thresholds, such as by having different charge transfer channel lengths, and/or a doped portion configured to set a voltage threshold for charge transfer. In some aspects, an integrated circuit may have a via structure having a plurality of vias extending between continuous portions of at least two metal layers. In some aspects, an integrated circuit may include a row of pixels and a voltage source configured to provide a voltage to bias a (Continued)

semiconductor substrate of the integrated circuit along the row of pixels.

21 Claims, 21 Drawing Sheets

Related U.S. Application Data

(60) Provisional application No. 63/007,035, filed on Apr. 8, 2020.

(52) U.S. Cl.
CPC .......... *G05F 1/46* (2013.01); *H01L 27/14603* (2013.01); *H01L 27/14614* (2013.01); *H01L 27/14616* (2013.01); *H01L 27/14636* (2013.01); *H01L 27/14643* (2013.01); *G01N 2021/6439* (2013.01)

(56) References Cited

U.S. PATENT DOCUMENTS

| | | | |
|---|---|---|---|
| 6,787,308 | B2 | 9/2004 | Balasubramanian et al. |
| 6,917,726 | B2 | 7/2005 | Levene et al. |
| 7,175,811 | B2 | 2/2007 | Bach et al. |
| 7,426,322 | B2 | 9/2008 | Hyde |
| 7,738,086 | B2 | 6/2010 | Shepard et al. |
| 7,820,983 | B2 | 10/2010 | Lundquist et al. |
| 7,834,329 | B2 | 11/2010 | Lundquist et al. |
| 7,838,847 | B2 | 11/2010 | Lundquist et al. |
| 8,053,742 | B2 | 11/2011 | Lundquist et al. |
| 8,207,509 | B2 | 6/2012 | Lundquist et al. |
| 8,274,040 | B2 | 9/2012 | Zhong et al. |
| 8,278,728 | B2 | 10/2012 | Murshid |
| 8,465,699 | B2 | 6/2013 | Fehr et al. |
| 8,471,219 | B2 | 6/2013 | Lundquist et al. |
| 8,471,230 | B2 | 6/2013 | Zhong et al. |
| 8,502,169 | B2 | 8/2013 | Rigneault et al. |
| 8,618,507 | B1 | 12/2013 | Lundquist et al. |
| 9,029,802 | B2 | 5/2015 | Lundquist et al. |
| 9,157,864 | B2 | 10/2015 | Fehr et al. |
| 9,222,123 | B2 | 12/2015 | Zhong et al. |
| 9,222,133 | B2 | 12/2015 | Lundquist et al. |
| 9,223,084 | B2 | 12/2015 | Grot et al. |
| 9,372,308 | B1 | 6/2016 | Saxena et al. |
| 9,488,584 | B2 | 11/2016 | McCaffrey et al. |
| 9,587,276 | B2 | 3/2017 | Lundquist et al. |
| 9,606,060 | B2 | 3/2017 | Chen et al. |
| 9,658,161 | B2 | 5/2017 | Saxena et al. |
| 9,666,748 | B2 | 5/2017 | Leobandung |
| 9,719,138 | B2 | 8/2017 | Zhong et al. |
| 9,765,395 | B2 | 9/2017 | Goldsmith |
| 9,946,017 | B2 | 4/2018 | Saxena et al. |
| 10,018,764 | B2 | 7/2018 | Grot et al. |
| 10,090,429 | B2 | 10/2018 | Leobandung |
| 10,138,515 | B2 | 11/2018 | Fehr et al. |
| 10,280,457 | B2 | 5/2019 | Zhong et al. |
| 10,310,178 | B2 | 6/2019 | Saxena et al. |
| 10,487,356 | B2 | 11/2019 | Lundquist et al. |
| 10,578,788 | B2 | 3/2020 | Grot et al. |
| 10,655,172 | B2 | 5/2020 | Rank et al. |
| 10,724,090 | B2 | 7/2020 | McCaffrey et al. |
| 11,573,180 | B2 | 2/2023 | Webster et al. |
| 2002/0182716 | A1 | 12/2002 | Weisbuch et al. |
| 2003/0174992 | A1 | 9/2003 | Levene et al. |
| 2004/0169842 | A1 | 9/2004 | Dosluoglu et al. |
| 2006/0192938 | A1* | 8/2006 | Kawahito ............. G01S 7/4863 356/5.03 |
| 2010/0065726 | A1 | 3/2010 | Zhong et al. |
| 2011/0204467 | A1 | 8/2011 | Ohchi et al. |
| 2011/0298079 | A1 | 12/2011 | Kawahito |
| 2012/0273653 | A1 | 11/2012 | Hynecek et al. |
| 2013/0070131 | A1 | 3/2013 | Ohkubo et al. |
| 2013/0116153 | A1 | 5/2013 | Bowen et al. |
| 2014/0077058 | A1 | 3/2014 | Sakano |
| 2014/0077283 | A1 | 3/2014 | Lenchenkov |
| 2015/0141267 | A1 | 5/2015 | Rothberg et al. |
| 2015/0264287 | A1 | 9/2015 | Shimotsusa et al. |
| 2016/0084761 | A1 | 3/2016 | Rothberg et al. |
| 2016/0133668 | A1 | 5/2016 | Rothberg et al. |
| 2016/0181298 | A1 | 6/2016 | Wan et al. |
| 2016/0344156 | A1 | 11/2016 | Rothberg et al. |
| 2016/0356718 | A1 | 12/2016 | Yoon et al. |
| 2017/0146479 | A1 | 5/2017 | Levine et al. |
| 2017/0276686 | A1 | 9/2017 | Marcotte et al. |
| 2017/0301715 | A1 | 10/2017 | Cheng et al. |
| 2018/0172906 | A1 | 6/2018 | Rothberg et al. |
| 2018/0173000 | A1 | 6/2018 | Rothberg et al. |
| 2018/0175582 | A1 | 6/2018 | Rothberg et al. |
| 2018/0180546 | A1 | 6/2018 | Rothberg et al. |
| 2019/0025511 | A1 | 1/2019 | Rothberg et al. |
| 2019/0292590 | A1 | 9/2019 | Zhong et al. |
| 2019/0391010 | A1 | 12/2019 | Thurston et al. |
| 2020/0072752 | A1 | 3/2020 | Cipriany |
| 2020/0408690 | A1 | 12/2020 | Yang et al. |
| 2021/0318238 | A1 | 10/2021 | Webster et al. |
| 2021/0318242 | A1 | 10/2021 | Webster et al. |

FOREIGN PATENT DOCUMENTS

| | | |
|---|---|---|
| EP | 3483938 A1 | 5/2019 |
| JP | 2006-135252 A | 5/2006 |
| WO | WO 2010/025331 A1 | 3/2010 |
| WO | WO 2011/103507 A1 | 8/2011 |
| WO | WO 2011/153962 A1 | 12/2011 |
| WO | WO 2016/022998 A2 | 2/2016 |
| WO | WO 2016/128198 A1 | 8/2016 |
| WO | WO 2016/187580 A1 | 11/2016 |
| WO | WO 2017/210413 A1 | 12/2017 |

OTHER PUBLICATIONS

Invitation to Pay Additional Fees for International Application No. PCT/US2015/044360 mailed Nov. 20, 2015.
International Search Report and Written Opinion for International Application No. PCT/US2015/044360 mailed Feb. 3, 2016.
International Search Report and Written Opinion for International Application No. PCT/US2017/068089 dated Mar. 27, 2018.
International Search Report and Written Opinion for International Application No. PCT/US2019/038105 mailed Nov. 26, 2019.
Invitation to Pay Additional Fees for International Application No. PCT/US2019/048824 mailed Dec. 9, 2019.
International Search Report and Written Opinion for International Application No. PCT/US2019/048824 mailed Jan. 31, 2020.
Invitation to Pay Additional Fees for International Application No. PCT/US2019/038105 mailed Sep. 16, 2019.
Invitation to Pay Additional Fees for International Application No. PCT/US2020/039868 mailed Oct. 22, 2020.
International Search Report and Written Opinion for International Application No. PCT/US2020/039868 mailed Dec. 15, 2020.
International Search Report and Written Opinion for International Application No. PCT/US2021/013501 mailed Apr. 14, 2021.
Invitation to Pay Additional Fees for International Application No. PCT/US2021/026239 mailed Nov. 10, 2021.
International Search Report and Written Opinion for International Application No. PCT/US2021/026239 mailed Jan. 14, 2022.
International Preliminary Report on Patentability for International Application No. PCT/US2021/026239 mailed Oct. 20, 2022.
Hale, Fibre Optic Sensors using Adiabatically Tapered Single Mode Fibres. Dissertation submitted to the University of Cambridge. Feb. 1994. 209 pages.
Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.
Swaminathan et al. A theoretical justification for single molecule peptide sequencing. PLoS Comput Biol. Feb. 25, 2015;11(2):e1004080. 17 pages.

(56) References Cited

OTHER PUBLICATIONS

Taitt et al., Evanescent wave fluorescence biosensors. Biosens Bioelectron. Jun. 2005;20(12):2470-87. Epub Dec. 8, 2004.
Yao et al., Single-molecule protein sequencing through fingerprinting: computational assessment. Physical biology. Aug. 11, 2015;12(5):055003. 7 pages.
U.S. Appl. No. 17/224,899, filed Apr. 7, 2021, Webster et al.
U.S. Appl. No. 17/224,925, filed Apr. 7, 2021, Webster et al.
EP 18202357.2, Mar. 15, 2019, Extended European Search Report.
PCT/US2015/044360, Nov. 20, 2015, Invitation to Pay Additional Fees.
PCT/US2015/044360, Feb. 3, 2016, International Search Report and Written Opinion.
PCT/US2017/068089, Mar. 27, 2018, International Search Report and Written Opinion.
PCT/US2019/048824, Dec. 9, 2019, Invitation to Pay Additional Fees.
PCT/US2019/048824, Jan. 31, 2020, International Search Report and Written Opinion.
PCT/US2019/038105, Nov. 26, 2019, International Search Report and Written Opinion.
PCT/US2019/038105, Sep. 16, 2019, Invitation to Pay Additional Fees.
PCT/US2020/039868, Oct. 22, 2020, Invitation to Pay Additional Fees.
PCT/US2020/039868, Dec. 15, 2020, International Search Report and Written Opinion.
PCT/US2021/013501, Apr. 14, 2021, International Search Report and Written Opinion.
PCT/US2021/026239, Nov. 10, 2021, Invitation to Pay Additional Fees.
PCT/US2021/026239, Jan. 14, 2022, International Search Report and Written Opinion.
PCT/US2021/026239, Oct. 20, 2022, International Preliminary Report on Patentability.

\* cited by examiner

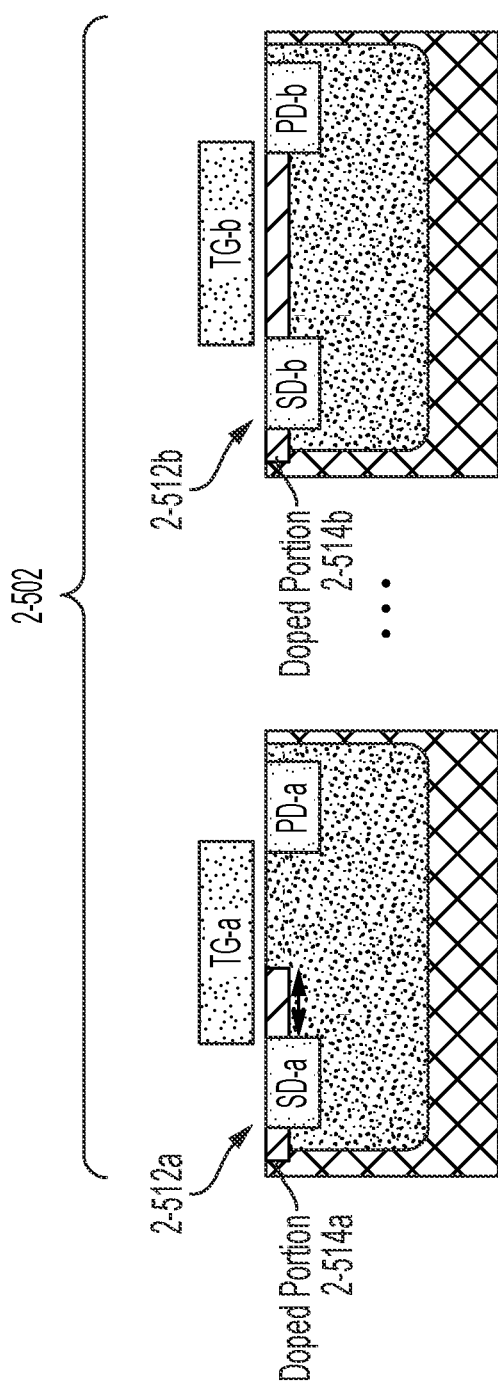
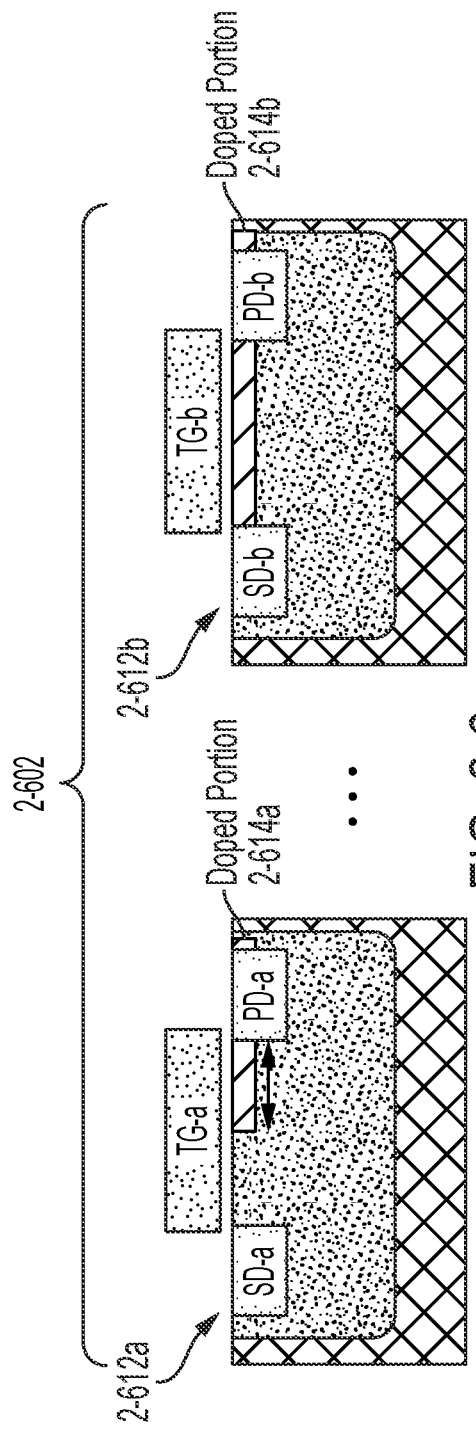
FIG. 2-5
FIG. 2-6

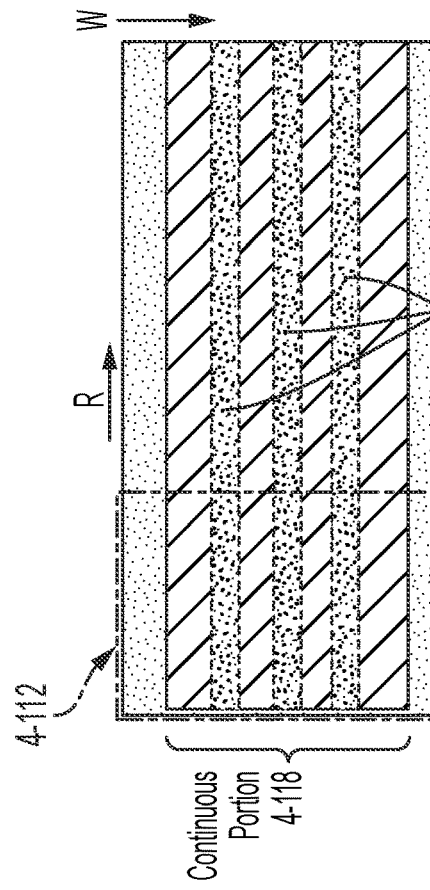
FIG. 4-1
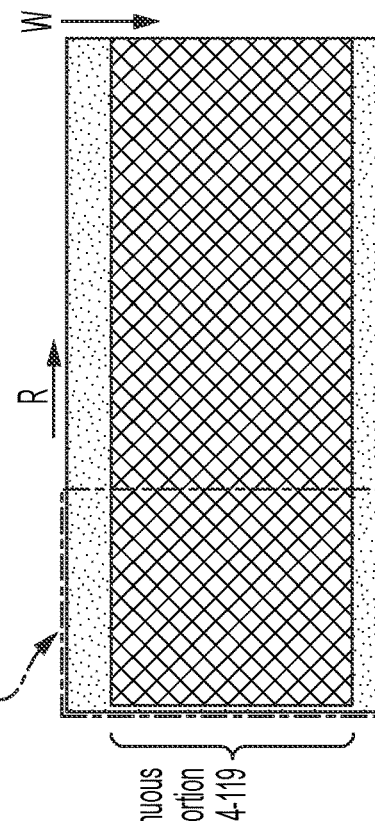
FIG. 4-2
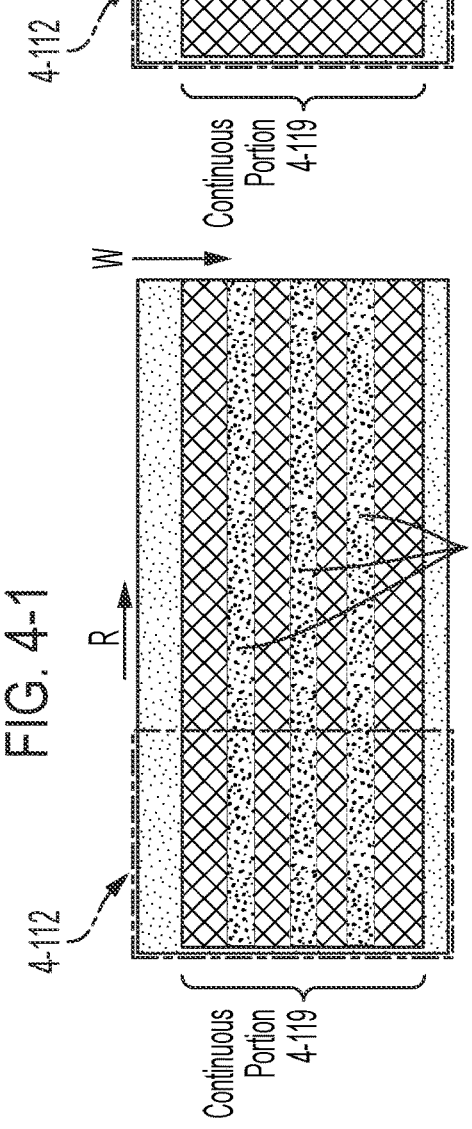
FIG. 4-3
FIG. 4-4

INTEGRATED SENSOR WITH REDUCED SKEW

RELATED APPLICATIONS

This application is a Continuation claiming the benefit under 35 U.S.C. § 120 of U.S. application Ser. No. 17/224,899, filed Apr. 7, 2021, under and entitled "INTEGRATED SENSOR WITH REDUCED SKEW," which is hereby incorporated herein by reference in its entirety.

U.S. application Ser. No. 17/224,899 claims priority under 35 U.S.C. § 119(e) to U.S. Provisional Application Ser. No. 63/007,035, filed Apr. 8, 2020, under No. and entitled, "INTEGRATED SENSOR WITH REDUCED SKEW," which is hereby incorporated herein by reference in its entirety.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Photodetectors are used to detect light in a variety of applications. Integrated photodetectors have been developed that produce an electrical signal indicative of the intensity of incident light. Integrated photodetectors for imaging applications include an array of pixels to detect the intensity of light received from across a scene. Examples of integrated photodetectors include charge coupled devices (CCDs) and Complementary Metal Oxide Semiconductor (CMOS) image sensors.

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY OF THE DISCLOSURE

Some aspects of the present disclosure relate to an integrated circuit comprising a first charge storage region, a first transfer gate configured to control, according to a control signal, a transfer of charge carriers to the first charge storage region, wherein the first transfer gate is configured to receive, at a first time having a first voltage, the control signal, a second charge storage region, and a second transfer gate configured to control, according to the control signal, a transfer of charge carriers to the second charge storage region, wherein the second transfer gate is configured to receive, substantially at the first time having a second voltage different from the first voltage the control signal.

Some aspects of the present disclosure relate to an integrated circuit comprising first and second charge storage regions and first and second charge transfer channels configured to propagate charge carriers to the first and second charge storage regions, wherein the first and second charge transfer channels have different first and second voltage thresholds, respectively.

Some aspects of the present disclosure relate to an integrated circuit comprising a first charge storage region, a first charge transfer channel configured to receive a first direct current (DC) bias voltage and a control signal and propagate charge carriers to the first charge storage region according to the control signal, a second charge storage region, and a second charge transfer channel configured to receive a second DC bias voltage and the control signal, the second DC bias voltage being different from the first DC bias voltage and propagate charge carriers to the second charge storage region according to the control signal.

The foregoing summary is not intended to be limiting. In addition, various embodiments may include any aspects of the disclosure either alone or in combination.

BRIEF DESCRIPTION OF DRAWINGS

FIG. 1-2 is a schematic of a pixel of an integrated device, according to some embodiments.

FIG. 1-3 is a circuit diagram of an exemplary pixel that may be included in the integrated device of FIG. 1-1, according to some embodiments.

FIG. 1-4 is a diagram illustrating charge transfer in the pixel of FIG. 1-3, according to some embodiments.

FIG. 1-5A is a plan view of an exemplary pixel that may be included in the integrated device of FIG. 1-1, the pixel having multiple charge storage regions, according to some embodiments.

FIG. 1-5B is a circuit diagram of the pixel of FIG. 1-5A, according to some embodiments.

FIG. 1-6 is a diagram illustrating charge transfer in the pixel of FIGS. 1-5A and 1-5B, according to some embodiments.

FIG. 2-1 is a schematic view of an exemplary row of pixels that may be included in the integrated device of FIG. 1-1, according to some embodiments.

FIG. 2-2A is a time graph illustrating an exemplary control signal as it may be received by a first pixel of the row of FIG. 2-1, according to some embodiments.

FIG. 2-2B is a time graph illustrating the exemplary control signal of FIG. 2-2A as it may be received by a second pixel of the row of FIG. 2-1, according to some embodiments.

FIG. 2-2C is a time graph illustrating the exemplary control signal of FIG. 2-2A as it may be received by a third pixel of the row of FIG. 2-1, according to some embodiments.

FIG. 2-3A is a time graph illustrating an alternative exemplary control signal as it may be received by the first pixel of the row of FIG. 2-1, according to some embodiments.

FIG. 2-3B is a time graph illustrating the exemplary control signal of FIG. 2-3A as it may be received by the second pixel of the row of FIG. 2-1, according to some embodiments.

FIG. 2-3C is a time graph illustrating the exemplary control signal of FIG. 2-3A as it may be received by the third pixel of the row of FIG. 2-1, according to some embodiments.

FIG. 2-4 is a side view of an exemplary integrated device having pixels with modulated channel lengths, according to some embodiments.

FIG. 2-5 is a side view of an exemplary integrated device having pixels with modulated channel lengths using doped channel portions, according to some embodiments.

FIG. 2-6 is a side view of an alternative exemplary integrated device having pixels with modulated channel lengths using doped channel portions, according to some embodiments.

FIG. 3-1A is a top view of an exemplary integrated device having pixels with modulated bias voltages, according to some embodiments.

FIG. 3-1B is a side view of a pixel of the integrated device of FIG. 3-1A, according to some embodiments.

FIG. 3-1C is a circuit diagram of part of a row of pixels of the integrated device of FIG. 3-1A, according to some embodiments.

FIG. 4-1 is a side view of a portion of an exemplary pixel having a via wall structure, according to some embodiments.

FIG. 4-2 is a top view of the portion of the pixel of FIG. 4-1 from a first position in the optical direction, according to some embodiments.

FIG. 4-3 is a top view of the portion of the pixel of FIG. 4-1 from a second position in the optical direction, according to some embodiments.

FIG. 4-4 is a top view of the portion of the pixel of FIG. 4-1 from a third position in the optical direction, according to some embodiments.

FIG. 5-1A is a block diagram of an integrated device and an instrument, according to some embodiments.

FIG. 5-1B is a schematic of an apparatus including an integrated device, according to some embodiments.

FIG. 5-1C is a block diagram depiction of an analytical instrument that includes a compact mode-locked laser module, according to some embodiments.

FIG. 5-1D depicts a compact mode-locked laser module incorporated into an analytical instrument, according to some embodiments.

FIG. 5-2 depicts a train of optical pulses, according to some embodiments.

FIG. 5-3 depicts an example of parallel reaction chambers that can be excited optically by a pulsed laser via one or more waveguides according to some embodiments.

FIG. 5-4 illustrates optical excitation of a reaction chamber from a waveguide, according to some embodiments.

FIG. 5-5 depicts further details of an integrated reaction chamber, optical waveguide, and time-binning photodetector, according to some embodiments.

FIG. 5-6 depicts an example of a biological reaction that can occur within a reaction chamber, according to some embodiments.

FIG. 5-7 depicts emission probability curves for two different fluorophores having different decay characteristics according to some embodiments.

FIG. 5-8 depicts time-binning detection of fluorescent emission, according to some embodiments.

FIG. 5-9 depicts a time-binning photodetector, according to some embodiments.

FIG. 5-10A depicts pulsed excitation and time-binned detection of fluorescent emission from a sample, according to some embodiments.

FIG. 5-10B depicts a histogram of accumulated fluorescent photon counts in various time bins after repeated pulsed excitation of a sample, according to some embodiments.

FIG. 5-11A-5-11D depict different histograms that may correspond to four nucleotides (T, A, C, G) or nucleotide analogs, according to some embodiments.

FIG. 5-12 is a flow diagram illustrating a method of sequencing a labeled polypeptide by Edman degradation according to some embodiments.

FIG. 5-13 includes a flow diagram illustrating a method of sequencing in which discrete binding events give rise to signal pulses of a signal output, and a graph illustrating the signal output according to some embodiments.

Figure 1:
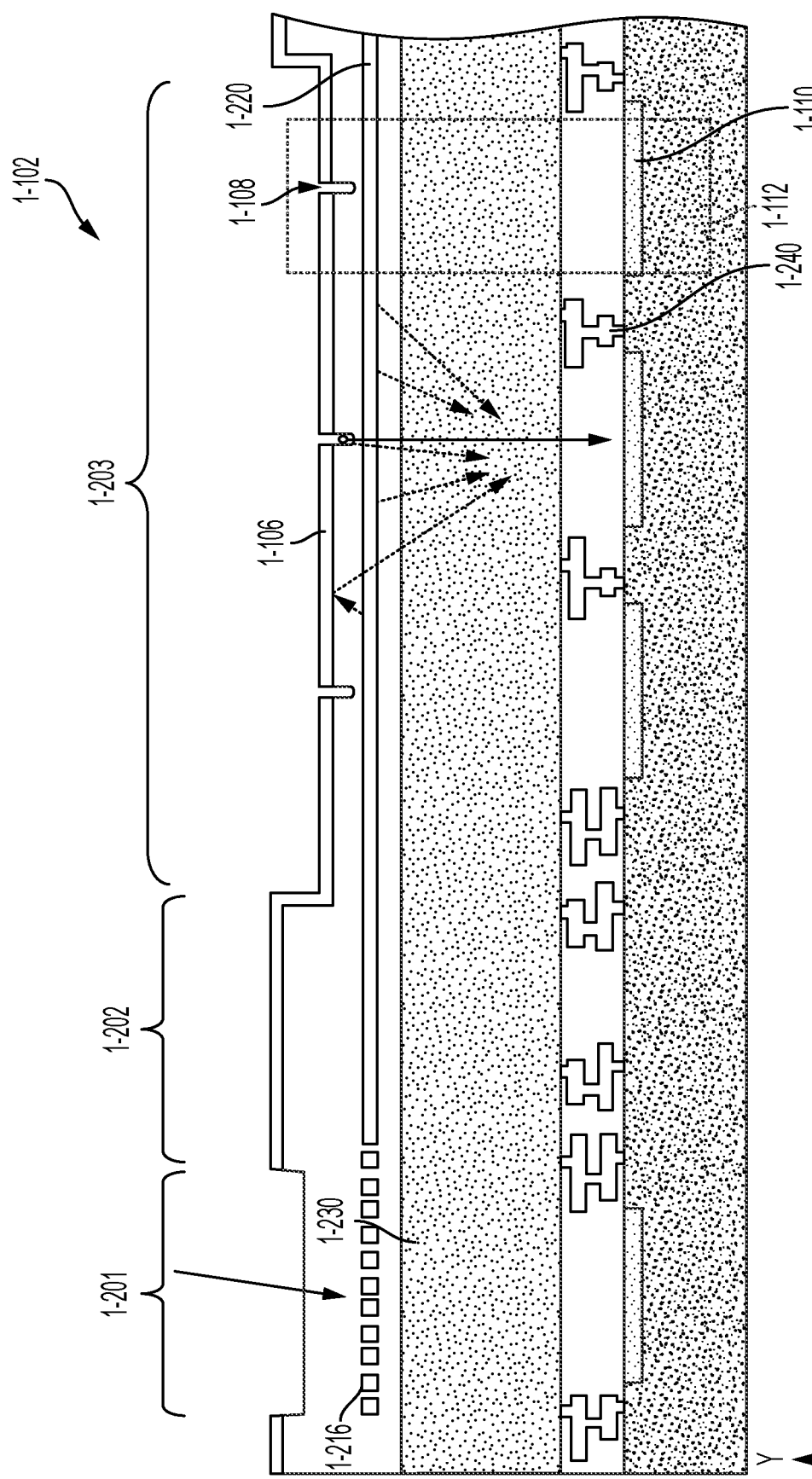
FIG. 1-1 is a schematic of an integrated device, according to some embodiments.

The features and advantages of the present invention will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction to Skew Mitigation and Compensation Techniques

Aspects of the present disclosure relate to integrated devices, instruments and related systems capable of analyzing samples in parallel, including identification of single molecules and nucleic acid sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device having sample wells configured to receive the sample and integrated optics formed on the integrated device and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetectors (e.g., photodiodes) on the integrated device may improve detection efficiency of fluorescent emissions from the sample wells and reduce the number of light-collection components that might otherwise be needed.

In some embodiments, pixels of the integrated device, each including a photodetector as described above, may be configured to receive incident photons at a photodetection region of the pixel, generate charge carriers in the photodetection region in response to receiving the incident photons, and collect the generated charge carriers in one or more charge storage regions. For example, by capturing the generated charge carriers following excitation of a sample, a quantity of captured charge carriers can be used to identify the sample, such as by correlating the arrival times of the fluorescent photons with fluorescence lifetimes. In some embodiments, the pixel can receive excitation photons used to excite a sample before receiving fluorescent photons emitted from the sample.

In some embodiments, each pixel may be configured to collect, in one or more charge storage regions, charge carriers generated in the photodetection region. For example, each pixel can be configured to transfer, to the charge storage region(s), charge carriers generated in the photodetection region in response to fluorescent photons. In some embodiments, each pixel can include one or more charge transfer channels electrically coupling the photodetection region to the charge storage region(s) and configured to propagate charge carriers from the photodetection region to the charge storage region(s).

In some embodiments, each pixel may include one or more transfer gates configured to, in response to receiving one or more control signals, control a transfer of charge carriers through the charge transfer channel(s) to the charge storage region(s). For example, a charge transfer channel may be configured to transfer charge carriers according to a control signal received at the charge transfer channel via a transfer gate, such as when the control signal, as received at the charge transfer channel, is above (or below) a voltage threshold of the charge transfer channel and to block charge carriers when the control signal is below the voltage threshold. In this example, the transfer gate may be configured to apply a voltage of the received control signal to the charge transfer channel to bias the charge transfer channel above (or below) the voltage threshold. In some embodiments, control signals described herein can be sinusoidal and/or square wave control signals oscillating between at least two voltage levels. For example, a control signal described herein can oscillate between a first voltage level that is above the voltage threshold of a charge transfer channel and a second voltage that is below the voltage threshold of the charge transfer channel. In some embodiments, a pixel may be configured to receive and apply, to a transfer gate configured to control a collection of charge carriers in the pixel, at a time corresponding to when fluorescent photons, rather than excitation photons, are expected to arrive at the photodetection region, a control signal having an appropriate voltage for collecting charge carriers.

In some embodiments, each pixel may be configured to discard, to one or more drain regions, charge carriers generated in the photodetection region in response to excitation photons. For example, the excitation photons, which may be used to excite the sample, can reach the photodetection region before fluorescent photons from the sample reach the photodetection region. In this example, charge carriers generated in response to the excitation photon discarded rather than collected with the fluorescent charge carriers, as the excitation photons can be indistinguishable from the fluorescent charge carriers, and thereby contaminate fluorescent measurements as noise. In some embodiments, each pixel may include one or more drain channels configured to propagate charge carriers from the photodetection region to the drain region(s) according to a drain control signal, which can be configured in the manner described above for charge collection.

Challenges arise in collecting fluorescent emission charge carriers in the charge storage regions of large pixel arrays (e.g., on the order of one million pixels) because control signals for operating the pixels may take varying amounts of time to reach each pixel due to the structure of the array, which can cause the control signals to arrive at different pixels with different voltages. For example, the control signals may propagate along paths of different lengths to reach the different pixels, resulting in signals arriving at different pixels with different propagation delays, that is, having skew. As a result, control signals that rise or fall in voltage over time can arrive at the different pixels with different voltages, some of the voltages being high (or low) enough to cause receiving pixels to collect charge carriers and some of the voltages not being high (or low) enough to cause receiving pixels to collect charge carriers. Thus, in this example, different pixels of the array can collect charge carriers at different times due to receiving the control signal with different voltages, which can be problematic for at least some applications, for which it may be advantageous for each pixel to collect and/or drain charge carriers at the same time.

To solve the above problems, the inventors developed techniques for reducing and/or mitigating the impact of skew in an integrated device that includes an array of pixels. According to some such techniques, an integrated device can be configured to compensate, at least in part, for skew in control signals received at one or more parts of the integrated device. In some embodiments, the integrated device can be configured to receive a control signal at first and second transfer gates at a first time, the control signal having a different voltage at the first transfer gate than at the second transfer gate at the first time. For example, the first and second transfer gates can be configured to control a transfer of charge carriers to first and second charge storage regions, respectively. By configuring the integrated device to receive control signals having different voltages at different transfer gates at substantially the same time, the integrated device can be configured to operate notwithstanding skew in the control signals. In some embodiments, a signal having different voltages at different transfer gates at substantially the same time may have the different voltages at the different transfer gates within a few picoseconds or shorter.

In some embodiments, charge transfer channels of integrated devices described herein can be configured with different voltage thresholds, which can compensate, at least in part, for skew in received control signals. In one example, a control signal that arrives at different pixels of the integrated device with different voltages at the same time may cause the charge transfer channels to reach their corresponding threshold voltages at the same time, such that each charge transfer channel is configured to propagate and/or block charge carriers at the same time. Accordingly, the different voltage thresholds of the integrated device can be configured to compensate for skew in received control signals.

In some embodiments, voltage thresholds of charge transfer channels of integrated devices described herein may be modulated by configuring the charge transfer channels with different channel lengths. In some embodiments, the voltage thresholds may be modulated by including doped portions of the charge transfer channel. For example, in some embodiments, the doped portions and the charge transfer channels may be doped with opposite conductivity types (e.g., n-type and p-type or vice versa). According to various embodiments, such techniques can be used alone or in combination.

In some embodiments, charge transfer channels of an integrated device can be configured to receive different direct current (DC) bias voltages. For example, the DC bias voltages may be received at one or more semiconductor substrate layers of the integrated device (e.g., within respective pixels). In some embodiments, the DC bias voltages received at each charge transfer channel may be configured such that, when superimposed over received control signals having different voltages at the same time, causes the charge transfer channels to reach their corresponding threshold voltages at the same time, such that each charge transfer channel is configured to propagate and/or block charge carriers at the same time.

In some embodiments, one or more pixels of an integrated device may include one or more via wall structures connecting two or more metal layers of the integrated device. For example, in some embodiments, the via wall structure(s) may be configured to provide one or more control signals to the pixel(s). In some embodiments, the via wall structure(s) may include vias extending between continuous portions of at least two metal layers of the integrated device, which can add less skew to control signals conducted using the via wall structures than using other structures, such as by having greater conductivity and/or less capacitance than such structures. Accordingly, such techniques may reduce skew in control signals received at pixels of the integrated device.

It should be appreciated that integrated devices described herein may incorporate any or all techniques described herein alone or in combination.

II. Exemplary Integrated Device for Skew Mitigation and/or Compensation

A cross-sectional schematic of integrated device 1-102 illustrating a row of pixels 1-112 is shown in FIG. 1-1. Integrated device 1-102 may include coupling region 1-201, routing region 1-202, and pixel region 1-203. Pixel region 1-203 may include a plurality of pixels 1-112 having sample wells 1-108 positioned on a surface at a location separate from coupling region 1-201, which is where excitation light (shown as the dashed arrow) couples to integrated device 1-102. Sample wells 1-108 may be formed through metal layer(s) 1-106. One pixel 1-112, illustrated by the dotted rectangle, is a region of integrated device 1-102 that includes a sample well 1-108 and one or more photodetectors 1-110 associated with the sample well 1-108. In some embodiments, each photodetector 1-110 may include a photodetection region and one or more charge storage regions configured to receive charge carriers generated in the photodetection region in response to incident light from the sample well 1-108. FIG. 1-1 illustrates the path of excitation light by coupling a beam of excitation light to coupling region 1-201 and to sample wells 1-108. The row of sample wells 1-108 shown in FIG. 1-1 may be positioned to optically couple with waveguide 1-220. Excitation light may illuminate a sample located within a sample well. The sample may reach an excited state in response to being illuminated by the excitation light. When a sample is in an excited state, the sample may emit emission light, which may be detected by one or more photodetectors associated with the sample well. FIG. 1-1 schematically illustrates an optical axis of emission light OPT from a sample well 1-108 to photodetector(s) 1-110 of pixel 1-112. The photodetector(s) 1-110 of pixel 1-112 may be configured and positioned to detect emission light from sample well 1-108. Examples of suitable photodetectors are described in U.S. patent application Ser. No. 14/821,656 titled "INTEGRATED DEVICE FOR TEMPORAL BINNING OF RECEIVED PHOTONS," which is incorporated herein by reference in its entirety. Alternative or additional examples of photodetectors are described further herein. For an individual pixel 1-112, a sample well 1-108 and its respective photodetector(s) 1-110 may be aligned along the optical axis OPT. In this manner, the photodetector(s) may overlap with the sample well within a pixel 1-112.

The directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker on a sample positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-108, which is proximate to where a sample may be positioned during operation, may be in the range of 100 nm to 500 nm, or any value or range of values in that range. In some embodiments the distance between metal layer(s) 1-106 and the bottom surface of a sample well 1-108 is approximately 300 nm, but other distances may be used, as embodiments described herein are not so limited.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a sample well 1-108 and photodetector(s) may be in the range of 5 $\mu$m to 15 $\mu$m, or any value or range of values in that range, in some embodiments, but the invention is not so limited. It should be appreciated that, in some embodiments, emission light may be provided through other means than an excitation light source and a sample well. Accordingly, some embodiments may not include sample well 1-108.

Photonic structure(s) 1-230 may be positioned between sample wells 1-108 and photodetectors 1-110 and configured to reduce or prevent excitation light from reaching photodetectors 1-110, which may otherwise contribute to signal noise in detecting emission light. As shown in FIG. 1-1, the one or more photonic structures 1-230 may be positioned between waveguide 1-220 and photodetectors 1-110. Photonic structure(s) 1-230 may include one or more optical rejection photonic structures including a spectral filter, a polarization filter, and a spatial filter. Photonic structure(s) 1-230 may be positioned to align with individual sample wells 1-108 and their respective photodetector(s) 1-110 along a common axis. Metal layers 1-240, which may be configured to route control signals and/or readout signals to and/or from portions of integrated device 1-102 as described further herein, may also act as a spatial filter, or polarization filter, in accordance with some embodiments. In such embodiments, one or more metal layers 1-240 may be positioned to block some or all excitation light from reaching photodetector(s) 1-110.

Coupling region 1-201 may include one or more optical components configured to couple excitation light from an external or internal excitation source. Coupling region 1-201 may include grating coupler 1-216 positioned to receive some or all of a beam of excitation light. Examples of suitable grating couplers are described in U.S. Pat. Application 62/435,693 titled "OPTICAL COUPLER AND WAVEGUIDE SYSTEM," which is incorporated herein by reference in its entirety. Grating coupler 1-216 may couple excitation light to waveguide 1-220, which may be configured to propagate excitation light to the proximity of one or more sample wells 1-108. Alternatively, coupling region 1-201 may comprise other well-known structures for coupling light into a waveguide, or directly into the sample wells.

Components located off of or within the integrated device may be used to position and align the excitation source 1-106 to the integrated device. Such components may include optical components including lenses, mirrors, prisms, windows, apertures, attenuators, and/or optical fibers. Additional mechanical components may be included in the instrument (to which the integrated device couples) to allow for control of one or more alignment components. Such mechanical components may include actuators, stepper motors, and/or knobs. Examples of suitable excitation sources and alignment mechanisms are described in U.S. patent application Ser. No. 15/161,088 titled "PULSED LASER AND SYSTEM," which is incorporated herein by reference in its entirety. Another example of a beam-steering module is described in U.S. patent application Ser. No. 15/842,720 titled "COMPACT BEAM SHAPING AND STEERING ASSEMBLY," which is incorporated herein by reference in its entirety.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well may act to confine a single molecule within the sample well, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells are carried out by exciting some or all of the samples within the wells using excitation light and detecting signals from sample fluorescent emissions using the photodetectors. Fluorescent emission light from a sample may reach one or more corresponding photodetectors and generate charge carriers therein, which can be collected in charge storage regions and read out from the photodetector(s) as at least one electrical signal. The electrical signals may be transmitted along metal lines (e.g., of metal layers 1-240) of the integrated device, which may be connected to an instrument interfaced with the integrated device. The electrical signals may be subsequently processed and/or analyzed. Processing or analyzing of electrical signals may occur on a suitable computing device either located on or off the instrument.

Figures 1, 2:
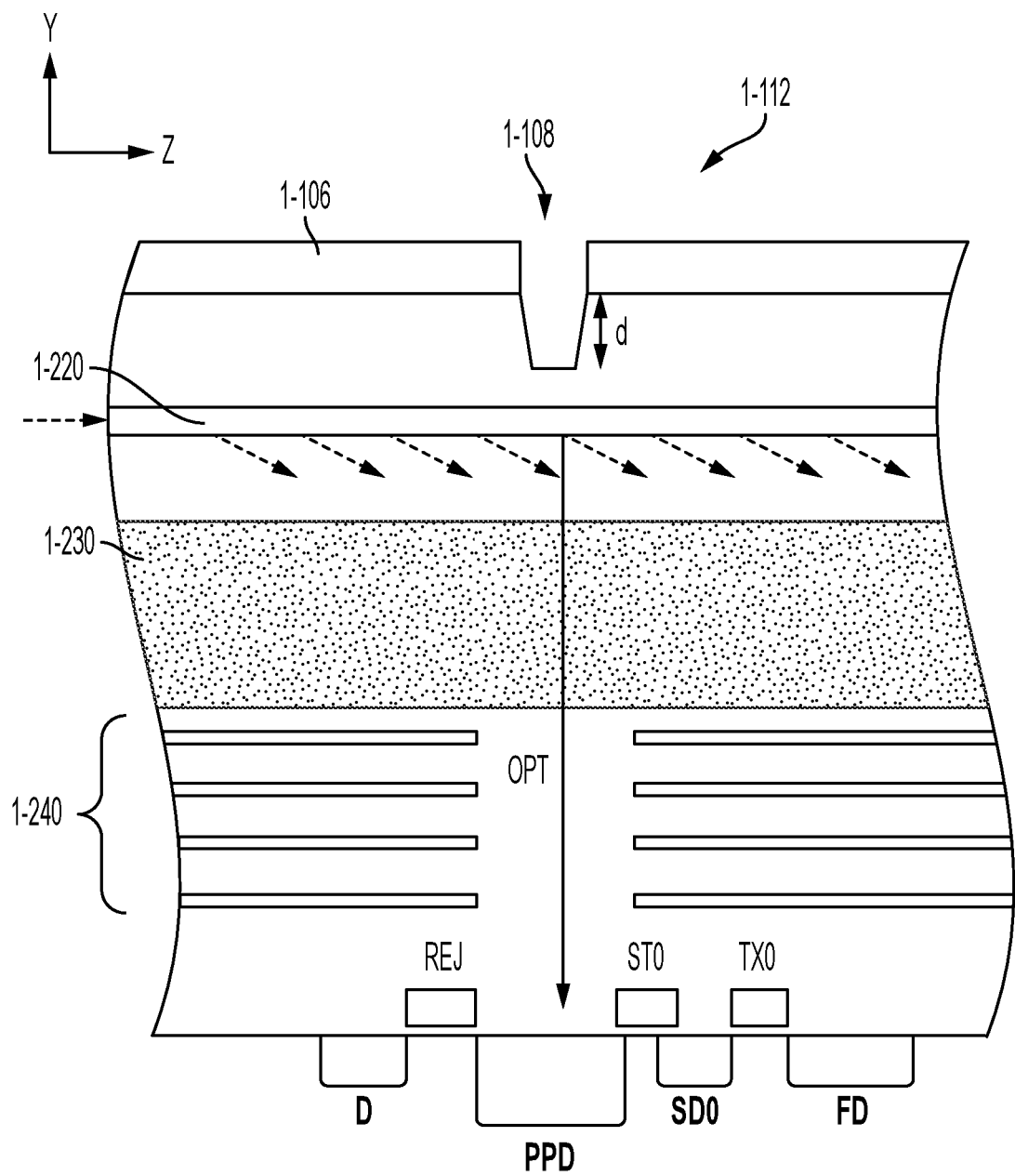

FIG. 1-2 illustrates a cross-sectional view of a pixel 1-112 of integrated device 1-102. Pixel 1-112 includes a photodetection region, which may be a pinned photodiode (PPD), a charge storage region, which may be a storage diode (SD0), a readout region, which may be a floating diffusion (FD) region, a drain region D, and transfer gates REJ, ST0, and TX0. In some embodiments, photodetection region PPD, charge storage region SD0, readout region FD, and/or drain region D may be formed in the integrated device 1-102 by doping portions of one or more substrate layers of the integrated device 1-102. For example, the integrated device 1-102 may have a lightly p-doped substrate, and photodetection region PPD, charge storage region SD0, readout region FD, and drain region D may be n-doped regions of the substrate. In this example, p-doped regions may be doped using boron and n-doped regions may be doped using phosphorus, although other dopants and configurations are possible. In some embodiments, pixel 1-112 may have an area smaller than or equal to 10 microns by 10 microns, such as smaller than or equal to 7.5 microns×5 microns. It should be appreciated that, in some embodiments, the substrate may be lightly n-doped and photodetection region PPD, charge storage region SD0, readout region FD, and/or drain region D may be p-doped, as embodiments described herein are not so limited.

In some embodiments, photodetection region PPD may be configured to generate charge carriers in response to incident light. For instance, during operation of pixel 1-112, excitation light may illuminate sample well 1-108 causing incident photons, including fluorescent emissions from a sample, to flow along the optical axis OPT to photodetection region PPD, which may be configured to generate fluorescent emission charge carriers in response to the incident photons from sample well 1-108. As described above, in some embodiments, excitation photons used to illuminate the sample well 1-108 may reach photodetection region PPD before the fluorescent emissions reach photodetection region PPD.

In some embodiments, in response to receiving the excitation photons, the integrated device 1-102 may be configured to generate excitation charge carriers in photodetection region PPD and transfer the excitation charge carriers to drain region D for discarding. In some embodiments, in response to receiving the fluorescent emissions, the integrated device 1-102 may be configured to generate and transfer the fluorescent emission charge carriers to charge storage region SD0. For example, as described further herein, transfer gates ST0 may be configured to control the transfer of charge carriers from photodetection region PPD to charge storage region SD0 and transfer gate REJ may be configured to control the transfer of charge carriers from photodetection region PPD to drain region D, respectively, based on control signals received at the different transfer gates. In this example, the period of time during which transfer gate REJ receives a control signal and transfers charge carriers (e.g., excitation charge carriers) to drain region D may be a drain period, and the period of time during which transfer gate ST0 receives a control signal and transfers charge carriers (e.g., fluorescent emission charge carriers) to charge storage region SD0 may be a collection period, where the drain period can occur following an excitation pulse, and the collection period can occur following the drain period.

In some embodiments, charge storage region SD0 may be configured to collect charge carriers generated in photodetection region PPD in response to the incident light. For example, charge storage region SD0 may be configured to receive and store charge carriers generated in photodetection region PPD in response to fluorescent emission photons from the sample well 1-108. In some embodiments, charge storage region SD0 may be configured to accumulate charge carriers received from photodetection region PPD over the course of multiple collection periods, each preceded by an excitation pulse. In some embodiments, charge storage region SD0 may be electrically coupled to photodetection region PPD by a charge transfer channel. In some embodiments, the charge transfer channel may be formed by doping a region of pixel 1-112 between photodetection region PPD and charge storage region SD0 with a same conductivity type as photodetection region PPD and charge storage region SD0 such that the charge transfer channel is configured to be conductive when at least a threshold voltage is applied to the charge transfer channel and nonconductive when a voltage less than (or greater than, for some embodiments) the threshold voltage is applied to the charge transfer channel. In some embodiments, the threshold voltage may be a voltage above (or below) which the charge transfer channel is depleted of charge carriers, such that charge carriers from photodetection region PPD may travel through the charge transfer channel to charge storage region SD0. For example, the threshold voltage may be determined based on the materials, dimensions, and/or doping configuration of the charge transfer channel.

In some embodiments, transfer gate ST0 may be configured to control a transfer of charge carriers from photodetection region PPD to charge storage region SD0. For instance, transfer gate ST0 may be configured to receive a control signal and responsively determine a conductivity of a charge transfer channel electrically coupling photodetection region PPD to charge storage region SD0. For example, when a first portion of a control signal is received at transfer gate ST0, transfer gate ST0 may be configured to bias the charge transfer channel to cause the charge transfer channel to be nonconductive, such that charge carriers are blocked from reaching charge storage region SD0. Alternatively, when a second portion of the control signal is received at transfer gate ST0, transfer gate ST0 may be configured to bias to the charge transfer channel to cause the charge transfer channel to be conductive, such that charge carriers may flow from photodetection region PPD to charge storage region SD0 via the charge transfer channel. In some embodiments, transfer gate ST0 may be formed of an electrically conductive and at least partially opaque material such as polysilicon.

In some embodiments, transfer gate TX0 may be configured to control a transfer of charge carriers from charge storage region SD0 to readout region FD in the manner described herein for transfer gate ST0 in connection with photodetection region PPD and charge storage region SD0. For example, following a plurality of collection periods during which charge carriers are transferred from photodetection region PPD to charge storage region SD0, charge carriers stored in charge storage region SD0 may be transferred to readout region FD to be read out to other portions of the integrated device 1-102 for processing.

In some embodiments, transfer gate REJ may be configured to control a transfer of charge carriers from photodetection region PPD to drain region D in the manner described herein for transfer gate ST0 in connection with photodetection region PPD and charge storage region SD0. For example, drain region D may be electrically coupled to photodetection region PPD by a drain transfer channel electrically coupled to transfer gate REJ, and transfer gate REJ may be configured to receive and bias the drain transfer channel with a control signal. In some embodiments, during a drain period following an excitation light pulse and preceding reception of fluorescent emission charge carriers, transfer gate REJ may be configured to receive a control signal that causes transfer gate REJ to bias the drain transfer channel to propagate charge carriers from photodetection region PPD to drain region D. In some embodiments, drain region D may be configured for coupling to a direct current (DC) power supply voltage, such as via metal lines of the integrated device 1-102. For example, drain region D may be configured to propagate received charge carriers (e.g., excitation charge carriers) to a DC power supply for discarding.

In some embodiments, pixel 1-112 may be configured to receive control signals from a control circuit at transfer gates REJ, ST0, and TX0. For example, metal lines of metal layers 1-240 may be configured to carry the control signals to pixels 1-112 of the integrated device 1-102. In some embodiments, a single metal line carrying a control signal may be electrically coupled to a plurality of pixels 1-112, such as an array, subarray, row, and/or column of pixels 1-112. For example, each pixel 1-112 in an array may be configured to receive a control signal from a same metal line and/or net such that the row of pixels 1-112 is configured to drain and/or collect charge carriers from photodetection region PPD at the same time. Alternatively or additionally, each row of pixels 1-112 in the array may be configured to receive different control signals (e.g., row-select signals) during a readout period such that the rows read out charge carriers one row at a time. In some embodiments, integrated device 1-102 may include the control circuit. For example, in some embodiments, integrated device 1-102 may include a second integrated device that includes the control circuit. In some embodiments, a system may include a circuit board with integrated device 1-102 and the second integrated device mounted on the circuit board. It should be appreciated that integrated device 1-102 may include and/or be coupled to a control circuit in any suitable way.

Figures 1, 2, 3:
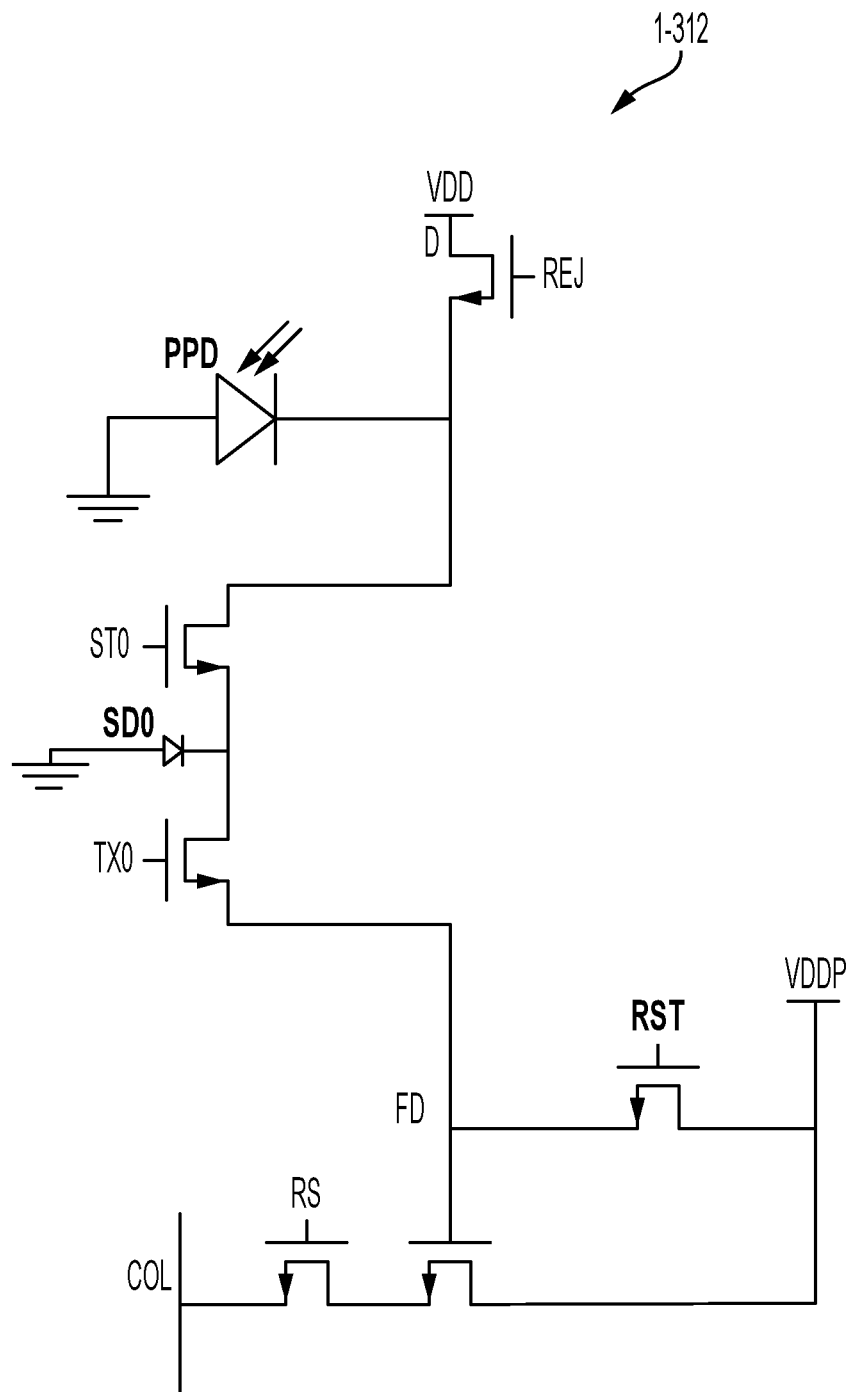

FIG. 1-3 is a circuit diagram of an exemplary pixel 1-312 that may be included in integrated device 1-102, according to some embodiments. In some embodiments, pixel 1-312 may be configured in the manner described herein for pixel 1-112. For example, as shown in FIG. 1-3, pixel 1-312 includes photodetection region PPD, charge storage region SD0, readout region FD, drain region D, and transfer gates REJ, ST0, and TX0. In FIG. 1-3, transfer gate REJ is the gate of a transistor coupling photodetection region PPD to drain region D, transfer gate ST0 is the gate of a transistor coupling photodetection region PPD to charge storage region SD0, and transfer gate TX0 is the gate of a transistor coupling charge storage region SD0 to readout region FD. As shown in FIG. 1-3, drain region D can be configured for coupling to a DC power supply voltage VDD. Pixel 1-312 also includes a reset (RST) transfer gate and a row-select (RS) transfer gate. In some embodiments, transfer gate RST may be configured to, in response to a reset control signal, clear charge carriers in readout region FD and/or charge storage region SD0. For example, transfer gate RST may be configured to cause charge carriers to flow from readout region FD and/or from charge storage region SD0 via transfer gate TX0 and readout region FD, to a DC supply voltage VDDP. In some embodiments, transfer gate RS may be configured to, in response to a row select control signal, transfer charge carriers from readout region FD to a bitline COL for processing.

While the transistors shown in FIG. 1-3 are field effect transistors (FETs), it should be appreciated that other types of transistors such as bipolar junction transistors (BJTs) may be used.

FIG. 1-4 is a diagram showing exemplary charge transfer in pixel 1-312, according to some embodiments. In some embodiments, operation of pixel 1-312 may include one or more collection sequences. An exemplary collection sequence is shown in FIG. 1-4 including a first collection period 1-1, a first readout period 1-2, a second collection period 1-3, and a second readout period 1-4. In some embodiments, each collection period of the collection sequence may be preceded by a drain period, as described further herein. In some embodiments, operation of pixel 1-312 may include one or multiple iterations of the collection sequence shown in FIG. 1-4. In some embodiments, the collection sequence may be coordinated with the excitation of samples in the sample wells 1-108. For example, a single control circuit may be configured to control the excitation light source and operation of pixels 1-312.

In some embodiments, the first collection period 1-1 may include receiving a first plurality of fluorescent emission photons at photodetection region PPD. For example, first collection period 1-1 may occur in response to a pulse of excitation light that illuminates a sample well 1-108 configured to emit fluorescent emission photons toward photodetection region PPD. As shown in FIG. 1-4, photodetection region PPD may be configured to generate charge carriers Q1 in response to the incident fluorescent emission photons and transfer charge carriers Q1 to charge storage region SD0 during the first collection period 1-1. In some embodiments, excitation photons may reach photodetection region PPD during a drain period immediately following the excitation pulse but before first collection period 1-1, during which charge carriers generated in photodetection region PPD in response to the excitation photons may be transferred to drain region D. In some embodiments, collection period 1-1 may be repeated multiple times in response to multiple respective excitation pulses, and charge carriers $Q_1$ may be accumulated in charge storage region SD0 over the course of the collection periods 1-1. In some such embodiments, each collection period 1-1 may be preceded by a drain period. In some embodiments, the collection periods 1-1 may occur at the same time for each pixel of an array, subarray, row, and/or column of the integrated device 1-102. Alternatively or additionally, in some embodiments, drain periods may occur at the same time for each pixel of the array, subarray, row, and/or column of the integrated device 1-102.

In some embodiments, the first readout period 1-2 may occur following one or more collection periods 1-1, where charge carriers Q1 are accumulated in charge storage region SD0 during the collection period(s) 1-1. As shown in FIG. 1-4, during the first readout period 1-2, charge carriers Q1 stored in charge storage region SD0 may be transferred to readout region FD to be read out for processing. In some embodiments, the readout period 1-2 may be performed using correlated double sampling (CDS) techniques. For example, a first voltage of readout region FD may be read out at a first time, followed by a reset of the readout region FD (e.g., by applying a reset signal to transfer gate RST) and the transfer of charge carriers Q1 from charge storage region SD0 to readout region FD, and a second voltage of readout region FD may be read out at a second time following the transfer of charge carriers Q1. In this example, the difference between the first and second voltages may indicate a quantity of charge carriers Q1 transferred from charge storage region SD0 to readout region FD. In some embodiments, the first readout period 1-2 may occur at a different time for each row, column, and/or pixel of an array. For example, by reading out pixels one row or column at a time, a single processing line may be configured to process readout of each row or column in sequence rather than dedicating a processing line to each pixel to read out simultaneously. In other embodiments, each pixel of an array may be configured to read out at the same time, as a processing line may be provided for each pixel of the array. According to various embodiments, charge carriers read out from the pixels may indicate fluorescence intensity, lifetime, spectral, and/or other such fluorescence information of the samples in the sample wells 1-108.

In some embodiments, the second collection period 1-3 may occur in the manner described herein for collection period 1-1. For example, following the first readout period 1-2, one or more second collection periods 1-3 may follow one or more respective excitation pulses, such as with a drain period preceding each collection period 1-3. As shown in FIG. 1-4, during the second collection period(s) 1-3, charge carriers Q2 generated in photodetection region PPD may be transferred to charge storage region SD0. In some embodiments, a delay between each excitation pulse and corresponding collection period 1-3 may be different from a delay between each excitation pulse and corresponding collection period 1-1. For example, by collecting charge carriers during a different time period following the excitation pulse during different collection periods, charge carriers read out from the collection periods 1-1 and 1-3 may indicate fluorescence lifetime information of the samples in the sample wells 1-108. In some embodiments, the second collection period(s) 1-3 may be followed by a second readout period 1-4 during which charge carriers accumulated in charge storage region SD0 over the course of the second collection period(s) may be read out in the manner described herein for the first readout period 1-2.

FIG. 1-5A is a plan view of pixel 1-512, which may be included in integrated device 1-102, according to some embodiments. In some embodiments, pixel 1-512 may be configured in the manner described herein for pixels 1-112 and 1-312. For example, in FIG. 1-5A, pixel 1-512 includes photodetection region PPD, charge storage region SD0, readout region FD, and transfer gates ST0, TX0, RST, SF, and RS. In addition, in FIG. 1-5A, pixel 1-512 includes a second charge storage region SD1 and transfer gates ST1 and TX1, which may be configured in the manner described herein for charge storage region SD0 and transfer gates ST0 and TX0, respectively. For example, charge storage regions SD0 and SD1 may be configured to receive charge carriers generated in photodetection region PPD, which may be transferred to readout region FD. In some embodiments, charge storage regions SD0 and SD1 may be configured to receive charge carriers from photodetection region PPD at different times relative to an excitation pulse. In some embodiments, a separate readout region FD may be coupled to each charge storage region. FIG. 1-5B is a circuit diagram of pixel 1-512, according to some embodiments.

FIG. 1-6 is a diagram illustrating exemplary charge transfer in pixel 1-512, according to some embodiments. In some embodiments, operation of pixel 1-512 may include one or multiple iterations of the collection sequence shown in FIG. 1-6, including first collection period 1-1', second collection period 1-2', first readout period 1-3', and second readout period 1-4'. In some embodiments, a drain period may precede first collection period 1-1' in each collection sequence.

In some embodiments, one or more first collection periods 1-1' may be performed in the manner described herein including in connection with first collection period 1-1, such as in response to one or more respective excitation pulses and/or having a drain period preceding each collection period 1-1'. As shown in FIG. 1-6, charge carriers Q1' may be generated in photodetection region PPD and transferred to charge storage region SD0. In some embodiments, one or more second collection periods 1-2' may occur following the first collection period(s) 1-1', during which charge carriers Q2' may be generated in photodetection region PPD and transferred to charge storage region SD1. For example, charge carriers Q2' may be transferred to charge storage region SD1 at a different time relative to the respective excitation pulse than charge carriers Q1' during first collection periods 1-1'. It should be appreciated that, in some embodiments, the first and second collection periods 1-1' and 1-2' may occur in response to the same one or more excitation pulses. For example, a common excitation pulse may cause fluorescent emission photons to reach photodetection region PPD over a period of time following the excitation pulse, and the period of time may be divided between a first collection period 1-1' during which charge carriers Q1' are transferred to charge storage region SD0 and a second collection period 1-2' during which charge carriers Q2' are transferred to charge storage region SD1. It should be appreciated that charge carriers Q1' and Q2' may be transferred to either charge storage region SD0 or SD1 and in either order, according to various embodiments.

In some embodiments, first readout period 1-3' may be performed in the manner described herein for first readout period 1-2 including in connection with FIG. 1-4. For example, as shown in FIG. 1-6, during the first readout period 1-3', charge carriers Q1' may be transferred from charge storage region SD0 to readout region FD. In some embodiments, second readout period 1-4' may occur following first readout period 1-3', and charge carriers Q2' may be transferred from charge storage region SD1 to readout region FD. It should be appreciated that charge carriers Q1' and Q2' may be read out in any order, according to various embodiments.

It should be appreciated that pixel 1-512 may be alternatively configured to operate in the manner described herein including in connection with FIG. 1-4, such as accumulating charge carriers in one charge storage region, reading out the charge carriers from the charge storage region, and then repeating this process with the other charge storage region. It should also be appreciated that, according to various embodiments, pixels described herein may include any number of charge storage regions.

III. Charge Transfer Channel Voltage Threshold Modulation

As described above, the inventors recognized that skew in control signals, such as due to varying electrical lengths between the control circuit and the pixels of a row, can be problematic for operation of an integrated device. FIG. 2-1 is a schematic view of an exemplary row of pixels 2-112a, 2-112b, and 2-112c that may be included in integrated device 1-102, according to some embodiments. In some embodiments, pixels 2-112a, 2-112b, and 2-112c may be configured in the manner described herein for pixel 1-112 and/or any other pixel(s) described herein. As shown in FIG. 2-1, pixels 2-112a, 2-112b, and 2-112c may be configured to receive a control signal B0 from a control circuit. For example, in some embodiments, the control circuit may be coupled to pixels 2-112a, 2-112b, and 2-112c via metal lines and/or structures described further herein. Also shown in FIG. 2-1, the control circuit may also be coupled to pixels 2-112a, 2-112b, and 2-112c via a ground return path to node BGND of the circuit.

In some embodiments, it may be advantageous for all of pixels 2-112a, 2-112b, and 2-112c to collect charge carriers at the same time or at substantially the same time and/or to discard charge carriers at the same time or at substantially the same time. For example, in some embodiments, charge carriers collected using pixels 2-112a, 2-112b, and 2-112c over the same or substantially the same interval of time may be used in a single measurement. In some embodiments, control signal B0 may be configured to control charge collection and/or draining in pixels 2-112a, 2-112b, and 2-112c. For example, in some embodiments, the control signal B0 may be configured to bias charge transfer channels coupling the photodetection regions PPD to the respective charge storage regions to initiate charge collection and/or drain charge carriers at the same time.

The inventors recognized, however, that a control signal provided to a row of pixels may accrue skew, such as a difference in its arrival time at each pixel due to the electrical distances traveled by the control signal to reach the different pixels. For example, as shown in FIG. 2-1, the control circuit may be configured to transmit control signal B0 from an end of the pixel row proximate pixel 2-112a to the end of the row proximate pixel 2-112c which can cause control signal B0 to reach pixel 2-112a before it reaches pixels 2-112b and 2-112c. For instance, a rising or falling edge of a square wave control signal B0 could reach pixel 2-112a at time t=0, pixel 2-112b at time t=10 picoseconds (ps), and pixel 2-112c at time t=20 ps, for a control signal B0 having a rise or fall time of 600 ps between low voltage (e.g., 0V) to high voltage (e.g., 3V) and/or vice versa. In some embodiments, the different arrival times of the control signals at different pixels can cause voltages at transfer gates and/or charge transfer channels of the pixels to be different at substantially the same time. In the above example, control signal B0 may have different voltages at pixels 2-112a and 2-112b at time t=0 where the rising or falling edge reaches pixel 2-112a at time t=0 but doesn't reach pixel 2-112b until time t=10 ps.

It should be appreciated that the timing of the above example is illustrative and other arrival times are possible according to various pixel array geometries and/or control signal configurations. While examples of rising or falling edges of a control signal arriving at pixels are described above and further herein, it should be appreciated that control signals can arrive at pixels at times when the control signals are not changing in voltage.

Figures 1, 2:
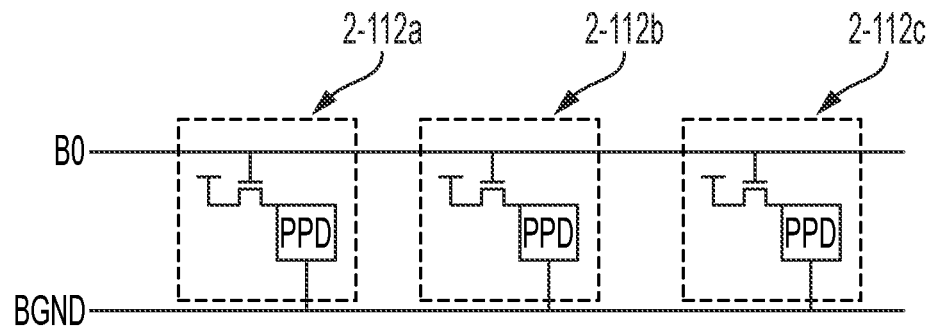
Figures 2, 2A:
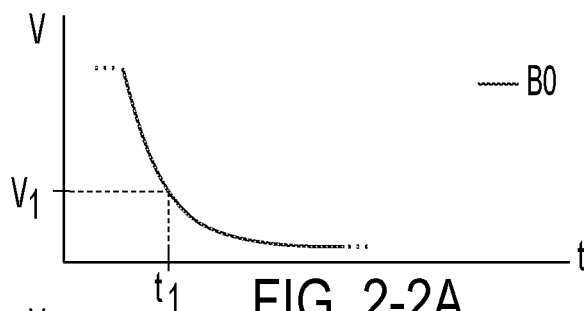

FIG. 2-2A is a time graph 2-200a illustrating control signal B0 as it may be received by pixel 2-112a, according to some embodiments. FIG. 2-2B is a time graph 2-200b illustrating control signal B0 as it may be received by pixel 2-112b, according to some embodiments. FIG. 2-2C is a time graph 2-200c illustrating control signal B0 as it may be received by pixel 2-112c, according to some embodiments. As shown in FIGS. 2-2A to 2-2C, control signal B0 may have different voltage levels $V_1$, $V_2$, and $V_3$ at respective pixels 2-112a, 2-112b, and 2-112c at a same time $t_1$. In FIGS. 2-2A to 2-2C, control signal B0 is shown decreasing over time, which results in the voltage level $V_1$ at pixel 2-112a being lower than voltage levels $V_2$ and $V_3$ at the other two pixels, as the portion of the signal having lower voltage level $V_1$ has not yet reached pixels 2-112b and 2-112c. Thus, pixels 2-112a, 2-112b, 2-112c effectively receive control signal B0 at different times, as the versions of the signal received at each pixel have different time delays upon arrival at the respective pixels. For instance, in some embodiments, at least 90% of delays in the control signal received at pixels of a row may be due to propagation delays associated with the electrical distances separating the pixels, and/or separating the pixels from the control circuit. Alternatively or additionally, versions of a control signal may arrive at the different pixels having different phases. As a result, the control signals may cause the pixels to collect and/or drain charge carriers at different times.

In accordance with various embodiments, electrical distances separating the pixels may result from physical distances and/or electrical characteristics of the pixels and/or the integrated circuit that includes the pixels. For example, electrical distances separating the pixels may result from physical distances the control signals travel from the control circuit to reach the respective pixels, which may cause corresponding propagation delays. Alternatively or additionally, the electrical distances separating the pixels may result from impedances (e.g., capacitances) that may generate corresponding electrical propagation delays, and/or differences in dielectrics along the paths of the control signals that may change the wave speed at which the control signals propagate in various portions of paths.

Figures 2, 3, 3A:
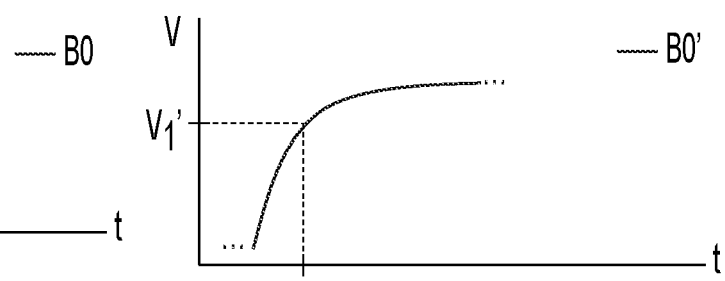
Figures 2, 2B:
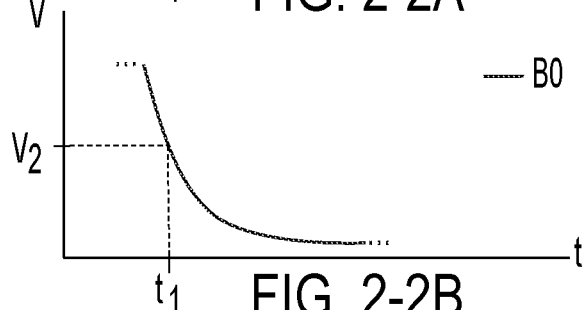
Figures 2, 3, 3B:
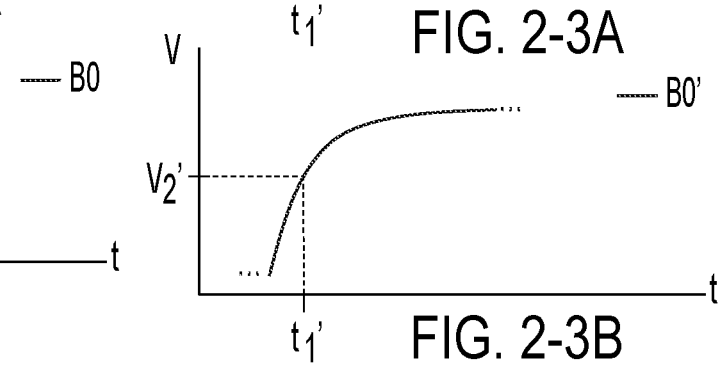
Figures 2, 2C:
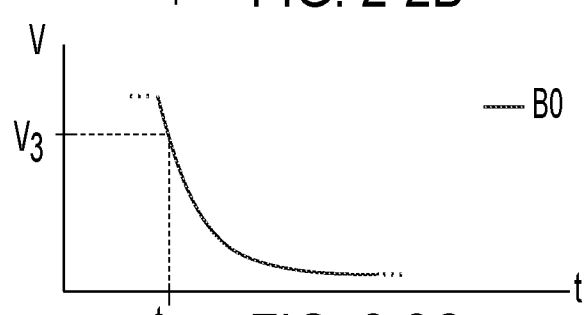
Figures 2, 3, 3C:
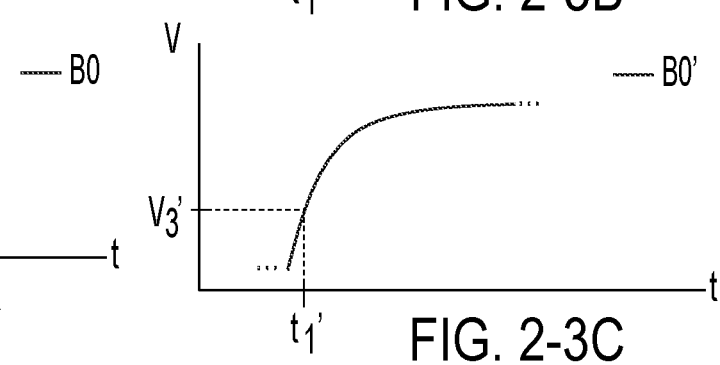
Figures 2, 3, 4:
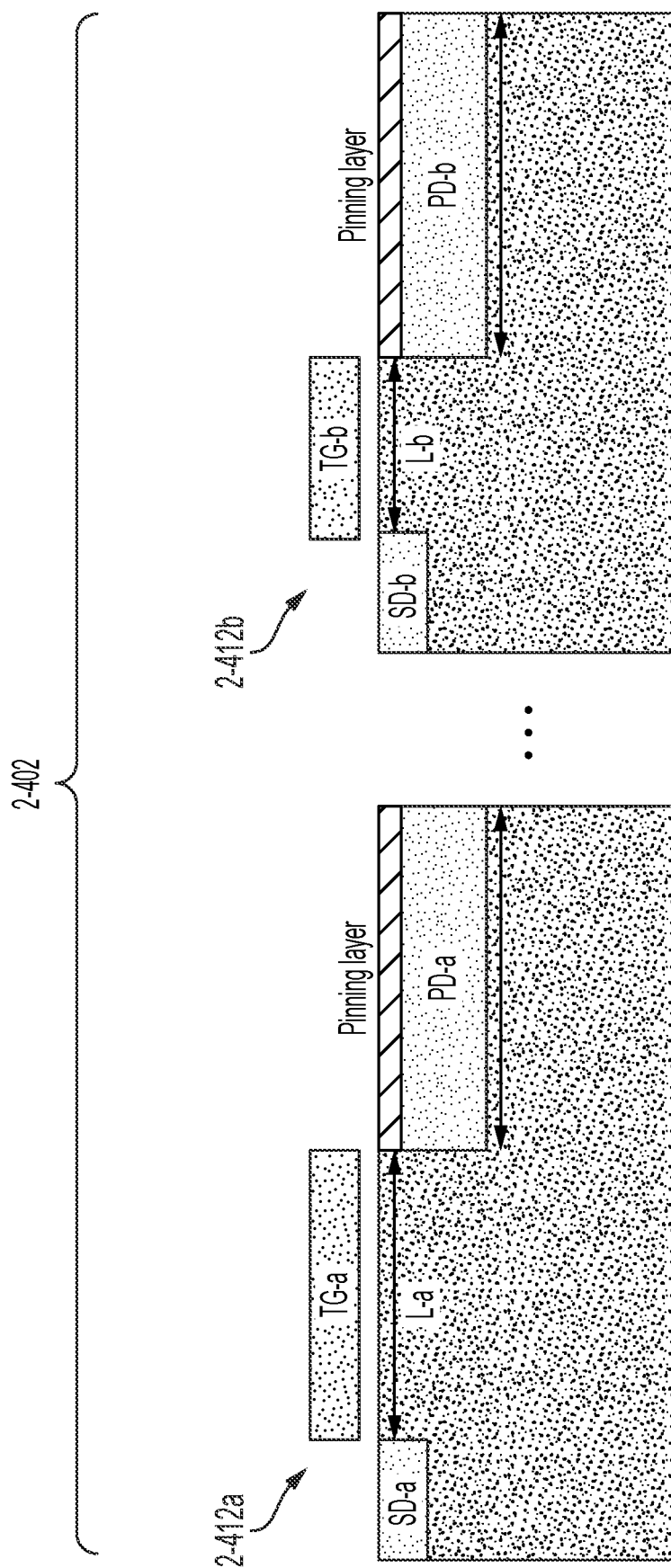

FIG. 2-3A is a time graph illustrating an alternative control signal B0' as it may be received by pixel 2-112a, according to some embodiments. FIG. 2-3B is a time graph illustrating control signal B0' as it may be received by pixel 2-112b, according to some embodiments. FIG. 2-3C is a time graph illustrating control signal B0' as it may be received by pixel 2-112c, according to some embodiments. In contrast to control signal B0, which is shown in FIGS. 2-2A to 2-2C decreasing over time at time $t_1$, control signal B0' is shown in FIGS. 2-3A to 2-3C increasing over time at time $t_1'$. For instance, as shown in FIGS. 2-3A to 2-3C, the voltage level $V_1'$ of control signal B0' at pixel 2-112a at time $t_1'$ is higher than voltage levels $V_2'$ and $V_3'$ of control signal B0' at pixels 2-112b and 2-112c at time $t_1'$, as the portion of control signal B0' having the higher voltage level $V_1'$ has not yet reached pixels 2-112b and 2-112c. Thus, in this example, pixels 2-112a, 2-112b, and 2-112c effectively receive control signal B0' at different times, as the signals have different time delays upon arrival at the different pixels. Alternatively or additionally, versions of the control signal may arrive at the different pixels having different phases.

In some embodiments, charge transfer channels of pixels 2-112a, 2-112b, and 2-112c may be configured to propagate charge carriers in response to receiving control signal B0'. For example, in some embodiments, the charge transfer channels of pixels 2-112a to 2-112b may include n-type semiconductor regions that become conductive upon receiving a voltage bias higher than the threshold voltages of the charge transfer channels. Alternatively or additionally, in some embodiments, charge transfer channels of pixels 2-112a, 2-112b, and 2-112c may be configured to propagate charge carriers in response to receiving control signal B0. For example, in some embodiments, the charge transfer channels may include p-type semiconductor regions that become conductive upon receiving a voltage bias lower than the threshold voltages of the charge transfer channels.

The inventors have developed techniques for modulating the threshold voltages of charge transfer channels in an integrated device to compensate, at least in part, for skew in received control signals. For example, as shown in FIGS. 2-2A to 2-2C, control signal B0 has different voltage levels $V_1$, $V_2$, and $V_3$ at pixels 2-112a, 2-112b, and 2-112c, respectively, at the same time $t_1$ due to different time delays and/or phases of control signal B0 upon reaching each pixel. In some embodiments, an integrated device may include charge transfer channels (e.g., in respective pixels of a row) having different threshold voltages, which can compensate, at least in part, for skew in a received control signal. For example, to compensate for skew in control signal B0 as shown in FIGS. 2-2A to 2-2C, pixels 2-112a, 2-112b, and 2-112c may include charge transfer channels having threshold voltages of V1, V2, and V3, which may allow each pixel to collect and/or drain charge carriers at time $t_1$ in response to control signal B0, despite the time difference between when control signal B0 reaches each pixel.

In some embodiments, threshold voltages of charge transfer channels of an integrated device may be modulated by using different charge transfer channel lengths and/or doped channel portions.

Figures 1, 2, 3, 4:
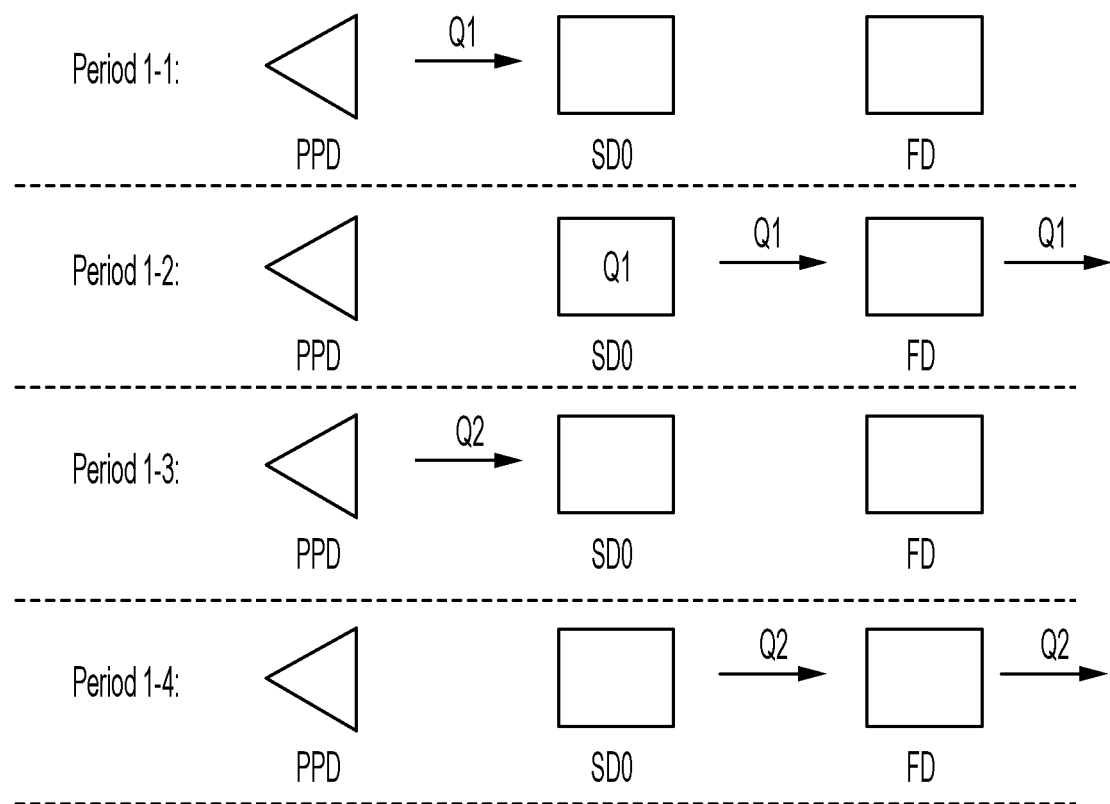

FIG. 2-4 is a side view of integrated device 2-402, which may include an array of pixels having modulated channel lengths, according to some embodiments. In some embodiments, integrated device 2-402 may be configured in the manner described herein for integrated device 1-102. For example, in some embodiments, integrated device 2-402 may include any number of pixels, of which pixels 2-412a and 2-412b are shown in FIG. 2-4. In some embodiments, pixels 2-412a and 2-412b may be configured in the manner described herein for pixels 1-112 and/or any other pixel(s) described herein. As shown in FIGS. 2-4, pixels 2-412a and 2-412b may include photodetection regions PD-a and PD-b, charge storage regions SD-a and SD-b, and transfer gates TG-a and TG-b, respectively. Alternatively or additionally, in some embodiments, pixel 2-412 may alternatively or additionally include one or more drain regions and/or drain gates.

In FIG. 2-4, charge transfer channels coupled between photodetection region PD-a and charge storage region SD-a and photodetection region PD-b and charge storage region SD-b may have different threshold voltages due to having different charge transfer channel lengths. For example, as shown in FIG. 2-4, the charge transfer channel of pixel 2-412a electrically coupling photodetection region PD-a to charge storage region SD-a has a channel length L-a in the direction of charge transfer, and the charge transfer channel of pixel 2-412b electrically coupling photodetection region PD-b to charge storage region SD-b has a channel length L-b, which may be different from channel length L-a. In this example, charge storage region SD-a may be disposed closer to photodetection region PD-a than charge storage region SD-b is disposed with respect to photodetection region PD-b, which may result in different degrees of drain-induced barrier lowering (DIBL) in each charge transfer channel. In some embodiments, the charge transfer channel of pixel 2-412a may have a longer channel length L-a, and thus a higher threshold voltage, than the charge transfer channel of pixel 2-412b.

In some embodiments, the charge transfer channels of pixels 2-412a and 2-412b may be configured to compensate for skew in a control signal received at each pixel. For example, in some embodiments, the control signal may be received at transfer gates TG-a and TG-b at different times. In this example, the different threshold voltages of the charge transfer channels of pixels 2-412a and 2-412b may cause the charge transfer channels to become conductive and/or nonconductive at the same time in response to the control signal, despite the control signal reaching each charge transfer channel at a different time.

In some embodiments, the charge transfer channels may be configured to begin and/or stop conducting charge carriers within 1 nanosecond of one another. In some embodiments, the charge transfer channels may be configured to begin and/or stop conducting charge carriers within 0.75 nanoseconds of one another. In some embodiments, the charge transfer channels may be configured to begin and/or stop conducting charge carriers within 0.5 nanoseconds of one another. In some embodiments, the charge transfer channels may be configured to begin and/or stop conducting charge carriers within 0.25 nanoseconds of one another. In some embodiments, the charge transfer channels may be configured to begin and/or stop conducting charge carriers within 0.1 nanoseconds of one another.

In some embodiments, threshold voltages of each pixel in a row of pixels may be modulated as described for pixels 2-412a and 2-412b. For instance, the threshold voltages of the pixels may be configured to increase as the row progresses from end to end. Referring to the example of FIG. 2-4, charge transfer channel lengths of the pixels of the row may be configured to increase as the row progresses. In some embodiments, the threshold voltages of the pixels may be higher at an end from which control signals are received, such that the threshold voltages of the end pixels (e.g., the highest and lowest threshold voltages) are reached at the same time. In some embodiments, the threshold voltages may be higher towards the middle of a row than at the ends, such as for configurations in which control signals are received in the middle of the row. Using the example of FIG. 2-4, charge transfer channel lengths of the pixels may increase towards the middle of the row. In some embodiments, adjacent rows of pixels may be configured with the same charge transfer channel threshold voltages. For example, each row may be configured to receive a same control signal, with some delay between when the control signal reaches the various pixels of the row. The different control signals for each row may have different time delays and/or phases with respect to one another. For instance, different rows of pixels may have offset rejection and/or collection periods.

It should be appreciated that imperfections in the charge transfer channels and/or in the control signals received by the different pixels may cause the pixels to not be exactly equally biased and/or conduct at exactly the same time. For instance, imperfections in manufacturing (e.g., doping) of the charge transfer channels may cause the charge transfer channels to not be biased completely equally even when the voltage thresholds are configured to compensate for delays in the control signals. Alternatively or additionally, imperfections such as noise or jitter in the control signals may cause the pixels to not conduct at exactly the same time, even when the voltage thresholds are configured to compensate for delays in the control signals. For instance, in some embodiments, charge transfer channels conducting charge carriers substantially at the same time may not conduct within 0.01 nanoseconds of one another owing to such imperfections, and as a result, may not conduct at exactly the same time.

FIG. 2-5 is a side view of integrated device 2-502 having pixels with modulated channel voltage thresholds using doped channel portions, according to some embodiments. In some embodiments, integrated device 2-502 may be configured in the manner described herein for integrated device 2-402. As shown in FIG. 2-5, integrated device 2-502 may include pixels 2-512a and 2-512b. In some embodiments, pixels 2-512a and 2-512b may be configured in the manner described herein for pixel 1-112 and/or any other pixel(s) described herein. As shown in FIGS. 2-5, pixels 2-512a and 2-512b may include photodetection regions PD-a and PD-b, charge storage regions SD-a and SD-b, and transfer gates TG-a and TG-b, respectively. In some embodiments, charge transfer channels coupling photodetection region PD-a to charge storage region SD-a and photodetection region PD-b to charge storage region SD-b may be substantially equal in length. For instance, photodetection region PD-a and charge storage region SD-a may have a same relative spacing as photodetection region PD-b and charge storage region SD-b. It should be appreciated that, in some embodiments, the charge transfer channels of pixels 2-512a and 2-512b may have different channel lengths.

In some embodiments, voltage thresholds of charge transfer channels of pixels 2-512a and 2-512b may be modulated using doped channel portions. For example, as shown in FIG. 2-5, pixel 2-512a may include a doped channel portion 2-514a disposed at least partially in the charge transfer channel of pixel 2-512a and pixel 2-512b may include a doped channel portion 2-514b disposed at least partially in the charge transfer channel of pixel 2-512b. In some embodiments, the doped channel portions 2-514a and 2-514b may have different lengths in the directions from the charge storage regions SD-a and SD-b to the photodetection regions PD-a and PD-b, respectively. For example, as shown in FIG. 2-5, doped channel portion 2-514a may have a first end positioned at charge storage region SD-a and a second end positioned between charge storage region SD-a and photodetection region PD-a. In contrast, as shown in FIG. 2-5, doped channel portion 2-514b may have a first end positioned at charge storage region SD-b and a second end positioned at photodetection region PD-b.

In some embodiments, a difference in doping type between charge storage regions SD-a and SD-b and/or charge transfer channel and doped channel portions 2-514a and 2-514b, respectively, may cause the voltage thresholds of the respective charge transfer channels to increase as opposed to without doped channel portions 2-514a and 2-514b. For example, in some embodiments, pixels 2-512a and 2-512b may include one or more lightly doped (e.g., p-doped) substrate layers, with more highly doped (e.g., n-doped) photodetection and charge storage regions disposed in and/or on the substrate layer(s). In this example, the voltage threshold of a charge transfer channel may increase as the length of the doped channel portion increases. In some embodiments, doped channel portions described herein may be formed using an implant, such as a boron implant (e.g., for an n-type charge transfer channel), disposed in and/or on the pixel. As described herein including with reference to FIG. 2-4, modulating the voltage threshold of a pixel in an array using one or more doped channel portions may compensate, at least in part, for skew effects such as propagation delays in received control signals.

FIG. 2-6 is a side view of integrated device 2-602, according to some embodiments. In some embodiments, integrated device 2-602 may be configured in the manner described herein for integrated device 2-502 including in connection with FIG. 2-5. As shown in FIG. 2-6, integrated device 2-602 may include pixels 2-612a and 2-612b, which may be configured in the manner described herein for pixel 1-112 and/or any other pixel(s) described herein. As shown in FIG. 2-6, doped channel portions 2-614a and 2-614b of pixels 2-612a and 2-612b, respectively, may extend from photodetection regions PD-a and PD-b to charge storage regions SD-a and SD-b, and may have different lengths. For example, as shown in FIG. 2-6, doped channel portion 2-614a may have a first end positioned at photodetection region PD-a and a second end positioned between photodetection region PD-a and charge storage region SD-a, and doped channel portion 2-614b may have a first end positioned at photodetection region PD-b and a second end positioned at charge storage region SD-b. In some embodiments, rows of pixels configured in the manner of pixels 2-512a and 2-512b and of pixels 2-612a and 2-612b may be positioned in a same pixel array and/or row.

It should be appreciated that, in some embodiments of the configurations illustrated in FIGS. 2-5 and 2-6, the substrate layer(s) may be lightly n-doped, the photodetection regions charge transfer channels, and charge storage regions may be more highly p-doped, and the doped channel portions may be highly n-doped. Alternatively or additionally, embodiments with multiple charge storage regions may include multiple doped channel portions that may have a same or different lengths.

IV. Techniques Incorporating Bias Voltage Modulation

The inventors have developed techniques to compensate, at least in part, for signal skew in pixels of an integrated device by applying one or more modulated voltage biases to one or more substrate layers of the integrated device. For instance, in some embodiments, one or more DC bias voltages may be applied to one or more substrate layers of an integrated device to be superimposed over voltages control signals received at transfer gates of the integrated device, thereby compensating, at least in part, for the skew. It should be appreciated that these techniques may be combined with other techniques described herein, such that one or more DC bias voltages may be applied and the voltage thresholds of the pixels may be modulated.

Figures 1B, 3:
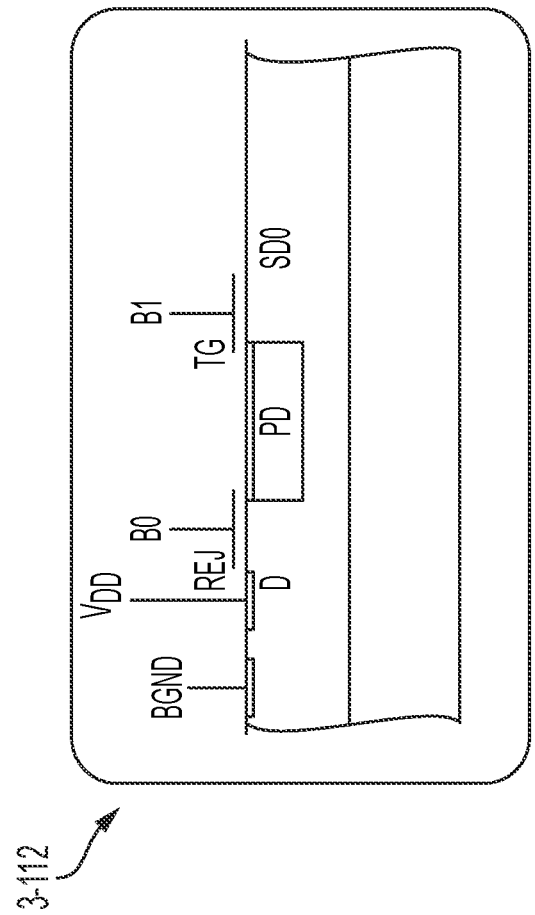
Figures 1A, 3:
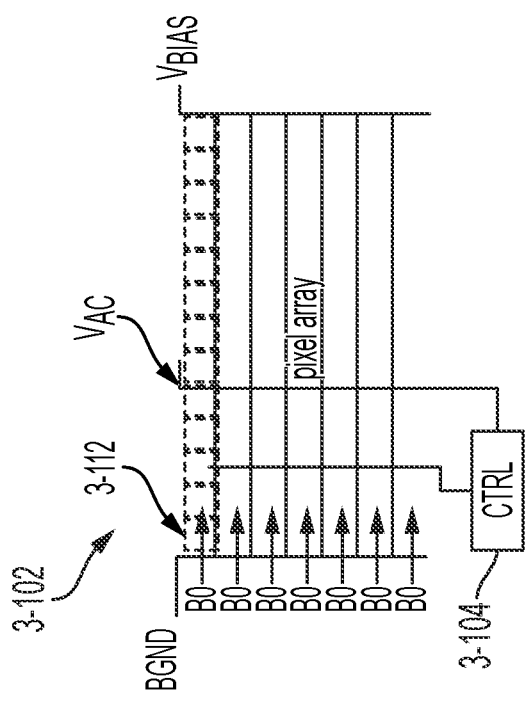

FIG. 3-1A is a top view of integrated device 3-102, according to some embodiments. In some embodiments, integrated device 3-102 may be configured in the manner described herein for integrated device 1-102. As shown in FIG. 3-1A, integrated device 3-102 may include one or more rows pixels 3-112, which may be configured in the manner described herein for pixel 1-112 and/or any other pixel(s) described herein. Also shown in FIG. 3-1A, pixels 3-112 may be configured to receive one or more control signals B0, a bias voltage $V_{BIAS}$, and a signal from a voltage source $V_{AC}$. In FIG. 3-1A, integrated device 3-102 may include and/or be coupled to a control circuit 3-104 that is configured to adjust voltage source $V_{AC}$. In some embodiments, control circuit 3-104 may be alternatively or additionally configured to provide control signals B0 to pixels 3-112 and/or to control bias voltage $V_{BIAS}$.

FIG. 3-1B is a side view of pixel 3-112 of integrated device 3-102, according to some embodiments. As shown in FIG. 3-1B, pixel 3-112 may include photodetection region PPD, charge storage region SD0, drain region D, and transfer gates TG and REJ, with transfer gate REJ configured to receive control signal B0 to control a transfer of charge carriers from photodetection region PPD to drain region D and with transfer gate TG configured to receive control signal B1 to control a transfer of charge carriers from photodetection region PPD to charge storage region SD0.

Also shown in FIG. 3-1B, pixel 3-112 may include an electrode BGND configured to receive DC bias voltage BGND. In some embodiments, a pixel positioned at an opposite end of the row of pixel 3-112 may include an electrode configured to receive DC bias voltage $V_{BIAS}$. In some embodiments, pixels of integrated device 3-102 positioned between pixel 3-112 and the pixel at the opposite end of the row may be configured to receive bias voltages $V_1$-$V_3$ via substrate resistances between adjacent pixels 3-112. It should be appreciated that any number of pixels can be configured to receive any number of corresponding bias voltages via electrodes and/or via substrate resistances between adjacent pixels, as embodiments described herein are not so limited.

Figures 1C, 3:
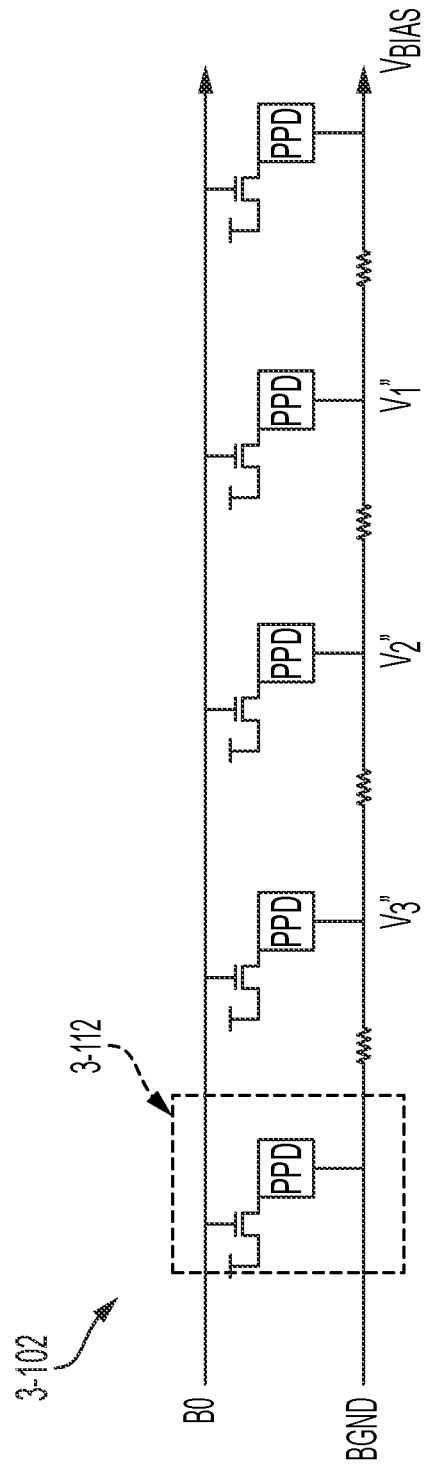

FIG. 3-1C is a circuit diagram of part of a row of pixels of integrated device 3-102. In some embodiments, integrated device 3-102 may be configured to apply modulated versions of bias voltage $V_{BIAS}$ to each pixel 3-112 in a row of pixels, such as to compensate, at least in part, for skew in control signals received at each pixel 3-112 of the row. For example, in some embodiments, by applying modulated versions of bias voltage $V_{BIAS}$ to pixels 3-112, the modulated versions of bias voltage $V_{BIAS}$ may add to or subtract from the voltages of a received control signal.

As shown in FIG. 3-1C, the row of pixels 3-112 may include resistances (e.g., substrate resistance and/or in metal lines coupling the substrate to bias voltage $V_{BIAS}$ coupled between pixels 3-112, which may be configured to modulate the version of bias voltage $V_{BIAS}$ received at each pixel 3-112. For example, in FIG. 3-1C, integrated device 3-102 may be configured to apply different bias voltages $V_{BIAS}$, $V_1"$, $V_2"$, $V_3"$, and BGND to pixels 3-112 of the row, where bias voltages $V_1"$, $V_2"$, $V_3"$ may be configured to increase or decrease from BGND to bias voltage $V_{BIAS}$. In this example, the resistances may be configured to form a resistive divider that divides the bias voltage $V_{BIAS}$ among bias voltages $V_1"$, $V_2"$, $V_3"$. In some embodiments, bias voltages $V_{BIAS}$, $V_1"$, $V_2"$, and $V_3"$ may be configured to add to or subtract from voltages of control signals applied to charge transfer channels of pixels 3-112, which may cause a same voltage to be applied the charge transfer channels of each pixel 3-112. In some embodiments, bias voltage $V_{BIAS}$ may be supplied using a direct current (DC) bias voltage source. For example, bias voltage $V_{BIAS}$ may be supplied from a DC bias voltage source having a voltage of 200 millivolts (mV), −200 mV, or any other suitable bias voltage. In the example in which the DC bias voltage source is configured to provide bias voltage $V_{BIAS}$ at 200 mV, bias voltages $V_1"$, $V_2"$, $V_3"$ in FIG. 3-1C may be 150 mV, 100 mV, and 50 mV, respectively, and BGND may be 0V.

While one end of the row of pixels 3-112 shown in FIG. 3-1C is shown coupled to a ground return path BGND, it should be appreciated that pixel 3-112 may be coupled to a voltage other than ground in some embodiments.

In some embodiments, integrated device 3-102 may be configured to use multiple voltages to compensate, at least in part, for skew in control signals received at pixels 3-112. For example, in some embodiments, integrated device 3-102 may be configured to apply to pixels 3-112 multiple bias voltages and/or voltage signals. As shown in FIG. 3-1A, voltage source $V_{AC}$ may be positioned adjacent a portion of the array of pixels 3-112. In some embodiments, voltage source $V_{AC}$ may include a metal bar configured to electrically couple to one or more substrate layers of the pixel array, such as via physical contact with the substrate layer(s). As shown in FIG. 3-1A, voltage source $V_{AC}$ may be positioned at or near a middle of rows of pixels 3-112 of integrated device 3-102. In some embodiments, voltage source $V_{AC}$ may be configured to generate an alternating current (AC) signal. For example, in some embodiments, voltage source $V_{AC}$ may be configured to superimpose the AC signal over the bias voltages $V_{BIAS}$, $V_1"$, $V_2"$, and $V_3"$. In some embodiments, voltage source $V_{AC}$ may be configured to provide, via the AC signal, a non-linear bias voltage component instead of or in addition to DC bias voltages $V_{BIAS}$, $V_1"$, $V_2"$, and $V_3"$. It should be appreciated that, in some embodiments, voltage source $V_{AC}$ may be positioned elsewhere with respect to the array of pixels.

In some embodiments, control circuit 3-104 may be configured to adjust voltage signals applied to pixels 3-112. For example, in some embodiments, control circuit 3-104 may include feedback circuitry configured to detect skew (e.g., propagation delay) in control signals received at the pixels and control voltage source $V_{AC}$ to adjust the AC signal based on the detected skew. In some embodiments, control circuit 3-104 may be configured to detect one or more non-linear delay components in one or more of the controls signals at one or more of the pixels and adjust the phase of the AC signal in response to the detected non-linear delay component(s). In this example, adjusting the phase of the AC signal may be configured to compensate, at least in part, for the detected non-linear delay component(s) (e.g., propagation delay of 10 ps). In some embodiments, voltage source $V_{AC}$ may be configured to add or subtract, to or from the AC signal, a nonlinear component for applying to the pixel substrate(s).

It should be appreciated that any number of AC and/or DC voltages may be applied to a row of pixels of an integrated device, in accordance with various embodiments.

V. Techniques Incorporating Via Wall Structures

The inventors developed techniques for reducing skew in an array of pixels of an integrated device by including via wall structures in at least some pixels. In some embodiments, an integrated device may include multiple metal layers configured to receive and distribute control signals to pixels of the integrated device. The inventors recognized that connections between the metal layers can add skew to the control signal as it is received at different pixels of the integrated device, such as by having high resistance and/or capacitance. To address this problem, the inventors developed via wall structures that can include low resistance and/or capacitance, which can reduce the amount of skew added to control signals distributed using the via wall structures.

FIG. 4-1 is a side view of a portion of pixel 4-112, according to some embodiments. In some embodiments, pixel 4-112 may be configured in the manner described herein for pixel 1-112 and/or any other pixel(s) described herein. As shown in FIG. 4-1, metal layers M1, M2, M3, and M4 of the integrated device that includes pixel 4-112 may be spaced from transfer gate TG of pixel 4-112, and from each other, in an optical direction OPT along which pixel 4-112 is configured to receive incident photons. Each metal layer may have a width in a width direction W perpendicular to the optical direction OPT. Pixel 4-112 includes a via wall structure, with vias 4-116 spaced from one another in the width direction W and coupled between metal layers M4 and M3. In some embodiments, metal layer M4 may be configured to receive a control signal from a control circuit of and/or coupled to the integrated device. In some embodiments, metal layer M3 may be configured to receive the control signal from metal layer M4 via vias 4-116 and distribute the control signal to one or more pixels of the integrated device. For example, in some embodiments, metal layer M3 may include a plurality of metal portions (e.g., electrically separate from one another) configured to receive the control signal and distribute the control signal to a plurality of respective groups (e.g., rows and/or columns) of pixels. Also shown in FIG. 4-1, portions of metal layers M1 and M2 can be coupled by vias 4-114, with the portions being discontinuous from one another (e.g., electrically separated in the width direction W).

FIG. 4-2 is a top view of the portion of pixel 4-112 shown in FIG. 4-1 from position A, according to some embodiments. As shown in FIG. 4-2, metal layer M4 can include a continuous portion 4-118 extending in a routing direction R perpendicular to the optical direction OPT and width direction W shown in FIG. 4-1. For example, in some embodiments, continuous portion 4-118 may be configured to provide one or more control signals to a plurality of pixel 4-112 positioned along the routing direction R. Vias 1-116 are shown in phantom in FIG. 4-2 beyond metal layer M4 in the optical direction OPT. In some embodiments, vias 4-116 may be coupled to continuous portion 4-118. For example, in some embodiments, continuous portion 4-118 may be configured to provide one or more control signals to pixels 4-112 using vias 4-116. As shown in FIG. 4-2, vias 4-116 may be longer in the routing direction R than in the width direction W.

FIG. 4-3 is a top view of the portion pixel 4-112 shown in FIG. 4-1 from position B, according to some embodiments. As shown in FIG. 4-3, metal layer M3 can include a continuous portion 4-119 extending in the routing direction R. In some embodiments, vias 4-116 may be coupled to continuous portion 4-119. For example, in some embodiments, continuous portion 4-119 may be configured to receive one or more control signals from vias 4-116 and provide the control signal(s) to pixels 4-112. FIG. 4-4 is a top view of the portion of pixel 4-112 shown in FIG. 4-1 from position C, according to some embodiments.

The inventors have recognized that interconnections between metal layers M4 and M3 can add skew to control signals propagated via the metal layers. For example, the resistance and capacitance of the metal layers may impact the rate at which the control signals propagate along a row of pixels. In this example, high resistance or capacitance can create a large resistance-capacitance (RC) time constant, which can add long propagation delays to the control signals. In FIG. 4-1, isolated vias 4-114 are shown coupling discontinuous portions of metal layers M1 and M2. As shown, isolated vias 4-114 are coupled to one another capacitively via a dielectric (e.g., oxide) gap between the vias. The capacitive coupling can contribute to a high RC time constant that skews control signals received by the pixels.

In some embodiments, vias 4-116 may be elongated in the routing direction R such that vias 4-116 are longer in the routing direction R than in the width direction W, which can produce less resistance and/or capacitance in the conductive path from continuous portion 4-118 to 4-119 than if a single via were included, or a plurality of vias that have the same length in the routing direction R than in the width direction W. In some embodiments, vias 4-116 and continuous portions 4-118 and 4-119 can all extend in the routing direction R, which can provide control signal routing to a row of pixels positioned along the routing direction R with reduced skew as compared to other configurations.

In some embodiments, metal layer M4 can include a second continuous portion configured to receive and/or distribute a second control signal to the plurality of pixels, such as via a second continuous portion of metal layer M3. Alternatively or additionally, in some embodiments, metal layer M3 can include multiple continuous portions that are electrically separate from one another, such as spaced from one another in the width direction, and each configured to receive a control signal from a continuous portion of metal layer M3 and provide the control signal to respective groups of pixels of the integrated device. In some embodiments, each continuous portion of metal layer M3 that is configured to receive a control signal from a continuous portion of metal layer M4 may be coupled to the continuous portion of metal layer M4 by a plurality of vias 4-116.

VI. DNA and/or RNA Sequencing Applications

An analytic system described herein may include an integrated device and an instrument configured to interface with the integrated device. The integrated device may include an array of pixels, where a pixel includes a reaction chamber and at least one photodetector. A surface of the integrated device may have a plurality of reaction chambers, where a reaction chamber is configured to receive a sample from a suspension placed on the surface of the integrated device. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. The plurality of reaction chambers may have a suitable size and shape such that at least a portion of the reaction chambers receive one sample from a suspension. In some embodiments, the number of samples within a reaction chamber may be distributed among the reaction chambers such that some reaction chambers contain one sample with others contain zero, two or more samples.

In some embodiments, a suspension may contain multiple single-stranded DNA templates, and individual reaction chambers on a surface of an integrated device may be sized and shaped to receive a sequencing template. Sequencing templates may be distributed among the reaction chambers of the integrated device such that at least a portion of the reaction chambers of the integrated device contain a sequencing template. The suspension may also contain labeled nucleotides which then enter in the reaction chamber and may allow for identification of a nucleotide as it is incorporated into a strand of DNA complementary to the single-stranded DNA template in the reaction chamber. In some embodiments, the suspension may contain sequencing templates and labeled nucleotides may be subsequently introduced to a reaction chamber as nucleotides are incorporated into a complementary strand within the reaction chamber. In this manner, timing of incorporation of nucleotides may be controlled by when labeled nucleotides are introduced to the reaction chambers of an integrated device.

Excitation light is provided from an excitation source located separate from the pixel array of the integrated device. The excitation light is directed at least in part by elements of the integrated device towards one or more pixels to illuminate an illumination region within the reaction chamber. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted from a reaction chamber (e.g., by a fluorescent label) may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more timing characteristics associated with emission light (e.g., fluorescence lifetime). The photodetector may detect a distribution of photon arrival times after a pulse of excitation light propagates through the integrated device, and the distribution of arrival times may provide an indication of a timing characteristic of the emission light (e.g., a proxy for fluorescence lifetime). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light. Output signals from the one or more photodetectors may then be used to distinguish a marker from among a plurality of markers, where the plurality of markers may be used to identify a sample or its structure. In some embodiments, a sample may be excited by multiple excitation energies, and emission light and/or timing characteristics of the emission light from the reaction chamber in response to the multiple excitation energies may distinguish a marker from a plurality of markers.

Figures 1, 2, 3, 4, 5, 5B:
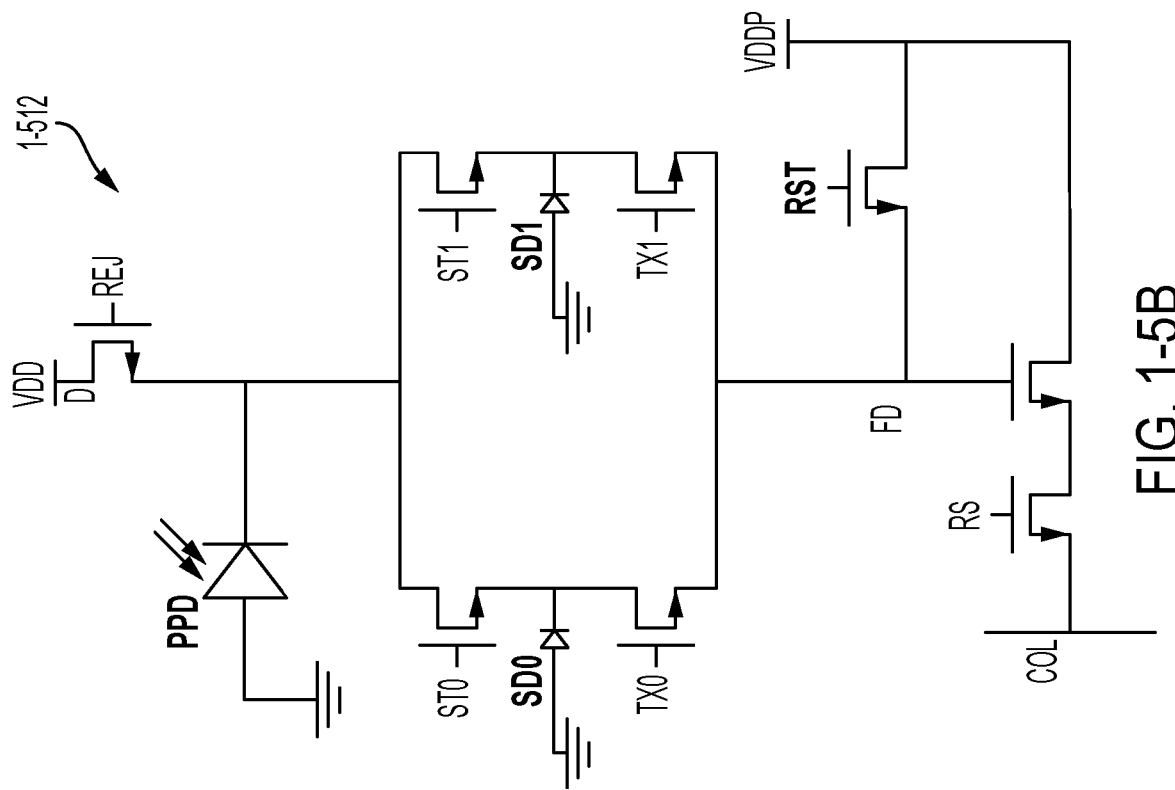
Figures 1, 2, 3, 4, 5, 5A:
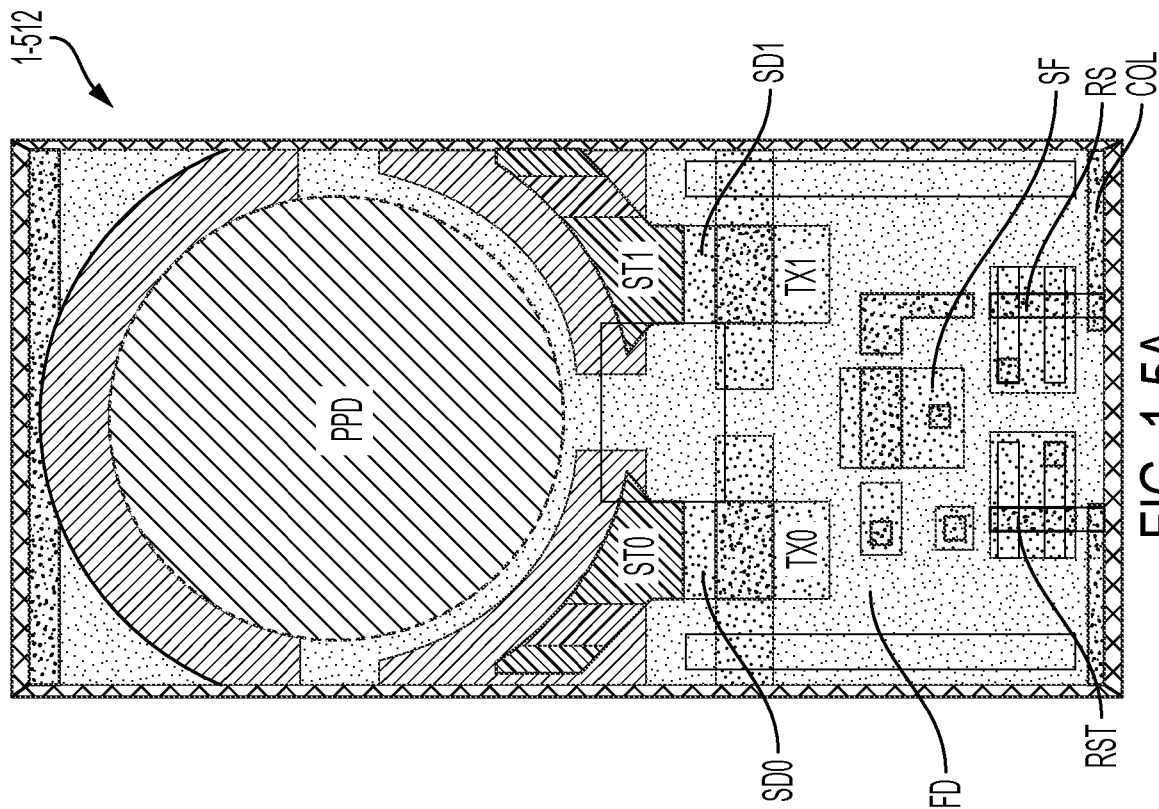

A schematic overview of the system 5-100 is illustrated in FIG. 5-1A. The system comprises both an integrated device 5-102 that interfaces with an instrument 5-104. In some embodiments, instrument 5-104 may include one or more excitation sources 5-106 integrated as part of instrument 5-104. In some embodiments, an excitation source may be external to both instrument 5-104 and integrated device 5-102, and instrument 5-104 may be configured to receive excitation light from the excitation source and direct excitation light to the integrated device. The integrated device may interface with the instrument using any suitable socket for receiving the integrated device and holding it in precise optical alignment with the excitation source. The excitation source 5-106 may be configured to provide excitation light to the integrated device 5-102. As illustrated schematically in FIG. 5-1A, the integrated device 5-102 has a plurality of pixels 5-112, where at least a portion of pixels may perform independent analysis of a sample of interest. Such pixels 5-112 may be referred to as "passive source pixels" since a pixel receives excitation light from a source 5-106 separate from the pixel, where excitation light from the source excites some or all of the pixels 5-112. Excitation source 5-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is incorporated by reference in its entirety. In some embodiments, excitation source 5-106 includes multiple excitation sources that are combined to deliver excitation light to integrated device 5-102. The multiple excitation sources may be configured to produce multiple excitation energies or wavelengths.

A pixel 5-112 has a reaction chamber 5-108 configured to receive a single sample of interest and a photodetector 5-110 for detecting emission light emitted from the reaction chamber in response to illuminating the sample and at least a portion of the reaction chamber 5-108 with excitation light provided by the excitation source 5-106. In some embodiments, reaction chamber 5-108 may retain the sample in proximity to a surface of integrated device 5-102, which may ease delivery of excitation light to the sample and detection of emission light from the sample or a reaction component (e.g., a labeled nucleotide).

Optical elements for coupling excitation light from excitation light source 5-106 to integrated device 5-102 and guiding excitation light to the reaction chamber 5-108 are located both on integrated device 5-102 and the instrument 5-104. Source-to-chamber optical elements may comprise one or more grating couplers located on integrated device 5-102 to couple excitation light to the integrated device and waveguides to deliver excitation light from instrument 5-104 to reaction chambers in pixels 5-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device by improving the uniformity of excitation light received by reaction chambers of the integrated device.

Reaction chamber 5-108, a portion of the excitation source-to-chamber optics, and the reaction chamber-to-photodetector optics are located on integrated device 5-102. Excitation source 5-106 and a portion of the source-to-chamber components are located in instrument 5-104. In some embodiments, a single component may play a role in both coupling excitation light to reaction chamber 5-108 and delivering emission light from reaction chamber 5-108 to photodetector 5-110. Examples of suitable components, for coupling excitation light to a reaction chamber and/or directing emission light to a photodetector, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are incorporated by reference in their entirety.

Pixel 5-112 is associated with its own individual reaction chamber 5-108 and at least one photodetector 5-110. The plurality of pixels of integrated device 5-102 may be arranged to have any suitable shape, size, and/or dimensions. Integrated device 5-102 may have any suitable number of pixels. The number of pixels in integrated device 5-102 may be in the range of approximately 10,000 pixels to 1,000,000 pixels or any value or range of values within that range. In some embodiments, the pixels may be arranged in an array of 512 pixels by 512 pixels. Integrated device 5-102 may interface with instrument 5-104 in any suitable manner. In some embodiments, instrument 5-104 may have an interface that detachably couples to integrated device 5-102 such that a user may attach integrated device 5-102 to instrument 5-104 for use of integrated device 5-102 to analyze at least one sample of interest in a suspension and remove integrated device 5-102 from instrument 5-104 to allow for another integrated device to be attached. The interface of instrument 5-104 may position integrated device 5-102 to couple with circuitry of instrument 5-104 to allow for readout signals from one or more photodetectors to be transmitted to instrument 5-104. Integrated device 5-102 and instrument 5-104 may include multi-channel, high-speed communication links for handling data associated with large pixel arrays (e.g., more than 10,000 pixels).

A cross-sectional schematic of integrated device 5-102 illustrating a row of pixels 5-112 is shown in FIG. 5-1B. Integrated device 5-102 may include coupling region 5-201, routing region 5-202, and pixel region 5-203. Pixel region 5-203 may include a plurality of pixels 5-112 having reaction chambers 5-108 positioned on a surface at a location separate from coupling region 5-201, which is where excitation light (shown as the dashed arrow) couples to integrated device 5-102. Reaction chambers 5-108 may be formed through metal layer(s) 5-116. One pixel 5-112, illustrated by the dotted rectangle, is a region of integrated device 5-102 that includes a reaction chamber 5-108 and a photodetection region having one or more photodetectors 5-110.

FIG. 5-1B illustrates the path of excitation (shown in dashed lines) by coupling a beam of excitation light to coupling region 5-201 and to reaction chambers 5-108. The row of reaction chambers 5-108 shown in FIG. 5-1B may be positioned to optically couple with waveguide 5-220. Excitation light may illuminate a sample located within a reaction chamber. The sample or a reaction component (e.g., fluorescent label) may reach an excited state in response to being illuminated by the excitation light. When in an excited state, the sample or reaction component may emit emission light, which may be detected by one or more photodetectors associated with the reaction chamber. FIG. 5-1B schematically illustrates the path of emission light (shown as the solid line) from a reaction chamber 5-108 to photodetector(s) 5-110 of pixel 5-112. The photodetector(s) 5-110 of pixel 5-112 may be configured and positioned to detect emission light from reaction chamber 5-108. Examples of suitable photodetectors are described in U.S. patent application Ser. No. 14/821,656, filed Aug. 7, 2015, titled "INTEGRATED DEVICE FOR TEMPORAL BINNING OF RECEIVED PHOTONS," which is incorporated by reference in its entirety. For an individual pixel 5-112, a reaction chamber 5-108 and its respective photodetector(s) 5-110 may be aligned along a common axis (along the y-direction shown in FIG. 5-1B). In this manner, the photodetector(s) may overlap with the reaction chamber within a pixel 5-112.

The directionality of the emission light from a reaction chamber 5-108 may depend on the positioning of the sample in the reaction chamber 5-108 relative to metal layer(s) 5-116 because metal layer(s) 5-116 may act to reflect emission light. In this manner, a distance between metal layer(s) 5-116 and a fluorescent marker positioned in a reaction chamber 5-108 may impact the efficiency of photodetector(s) 5-110, that are in the same pixel as the reaction chamber, to detect the light emitted by the fluorescent marker. The distance between metal layer(s) 5-116 and the bottom surface of a reaction chamber 5-108, which is proximate to where a sample may be positioned during operation, may be in the range of 100 nm to 500 nm, or any value or range of values in that range. In some embodiments the distance between metal layer(s) 5-116 and the bottom surface of a reaction chamber 5-108 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a reaction chamber 5-108 and photodetector(s) may be in the range of 1 µm to 15 µm, or any value or range of values in that range.

Photonic structure(s) 5-230 may be positioned between reaction chambers 5-108 and photodetectors 5-110 and configured to reduce or prevent excitation light from reaching photodetectors 5-110, which may otherwise contribute to signal noise in detecting emission light. As shown in FIG. 5-1B, the one or more photonic structures 5-230 may be positioned between waveguide 5-220 and photodetectors 5-110. Photonic structure(s) 5-230 may include one or more optical rejection photonic structures including a spectral filter, a polarization filter, and a spatial filter. Photonic structure(s) 5-230 may be positioned to align with individual reaction chambers 5-108 and their respective photodetector(s) 5-110 along a common axis. Metal layers 5-240, which may act as a circuitry for integrated device 5-102, may also act as a spatial filter, in accordance with some embodiments. In such embodiments, one or more metal layers 5-240 may be positioned to block some or all excitation light from reaching photodetector(s) 5-110.

Coupling region 5-201 may include one or more optical components configured to couple excitation light from an external excitation source. Coupling region 5-201 may include grating coupler 5-216 positioned to receive some or all of a beam of excitation light. Examples of suitable grating couplers are described in U.S. patent application Ser. No. 15/844,403, filed Dec. 15, 2017, titled "OPTICAL COUPLER AND WAVEGUIDE SYSTEM," which is incorporated by reference in its entirety. Grating coupler 5-216 may couple excitation light to waveguide 5-220, which may be configured to propagate excitation light to the proximity of one or more reaction chambers 5-108. Alternatively, coupling region 5-201 may comprise other well-known structures for coupling light into a waveguide.

Components located off of the integrated device may be used to position and align the excitation source 5-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088, filed May 20, 2016, titled "PULSED LASER AND SYSTEM," which is incorporated by reference in its entirety. Another example of a beam-steering module is described in U.S. patent application Ser. No. 15/842,720, filed Dec. 14, 2017, titled "COMPACT BEAM SHAPING AND STEERING ASSEMBLY," which is incorporated herein by reference.

A sample to be analyzed may be introduced into reaction chamber 5-108 of pixel 5-112. The sample may be a biological sample or any other suitable sample, such as a chemical sample. In some cases, the suspension may include multiple molecules of interest and the reaction chamber may be configured to isolate a single molecule. In some instances, the dimensions of the reaction chamber may act to confine a single molecule within the reaction chamber, allowing measurements to be performed on the single molecule. Excitation light may be delivered into the reaction chamber 5-108, so as to excite the sample or at least one fluorescent marker attached to the sample or otherwise associated with the sample while it is within an illumination area within the reaction chamber 5-108.

In operation, parallel analyses of samples within the reaction chambers are carried out by exciting some or all of the samples within the reaction chambers using excitation light and detecting signals with the photodetectors that are representative of emission light from the reaction chambers. Emission light from a sample or reaction component (e.g., fluorescent label) may be detected by a corresponding photodetector and converted to at least one electrical signal. The electrical signals may be transmitted along conducting lines (e.g., metal layers 5-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

Instrument 5-104 may include a user interface for controlling operation of instrument 5-104 and/or integrated device 5-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 5-102, and/or data generated from the readout signals of photodetector 5-110.

In some embodiments, instrument 5-104 may include a processing device configured to analyze data received from one or more photodetectors of integrated device 5-102 and/or transmit control signals to excitation source(s) 5-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 5-102.

Referring to FIG. 5-1C, a portable, advanced analytic instrument 5-100 can comprise one or more pulsed optical sources 5-106 mounted as a replaceable module within, or otherwise coupled to, the instrument 5-100. The portable analytic instrument 5-100 can include an optical coupling system 5-115 and an analytic system 5-160. The optical coupling system 5-115 can include some combination of optical components (which may include, for example, none, one from among, or more than one component from among the following components: lens, mirror, optical filter, attenuator, beam-steering component, beam shaping component) and be configured to operate on and/or couple output optical pulses 5-122 from the pulsed optical source 5-106 to the analytic system 5-160. The analytic system 5-160 can include a plurality of components that are arranged to direct the optical pulses to at least one reaction chamber for sample analysis, receive one or more optical signals (e.g., fluorescence, backscattered radiation) from the at least one reaction chamber, and produce one or more electrical signals representative of the received optical signals. In some embodiments, the analytic system 5-160 can include one or more photodetectors and may also include signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-160 can also include data transmission hardware configured to transmit and receive data to and from external devices (e.g., one or more external devices on a network to which the instrument 5-100 can connect via one or more data communications links). In some embodiments, the analytic system 5-160 can be configured to receive a bio-optoelectronic chip 5-140, which holds one or more samples to be analyzed.

Figures 1A, 5:
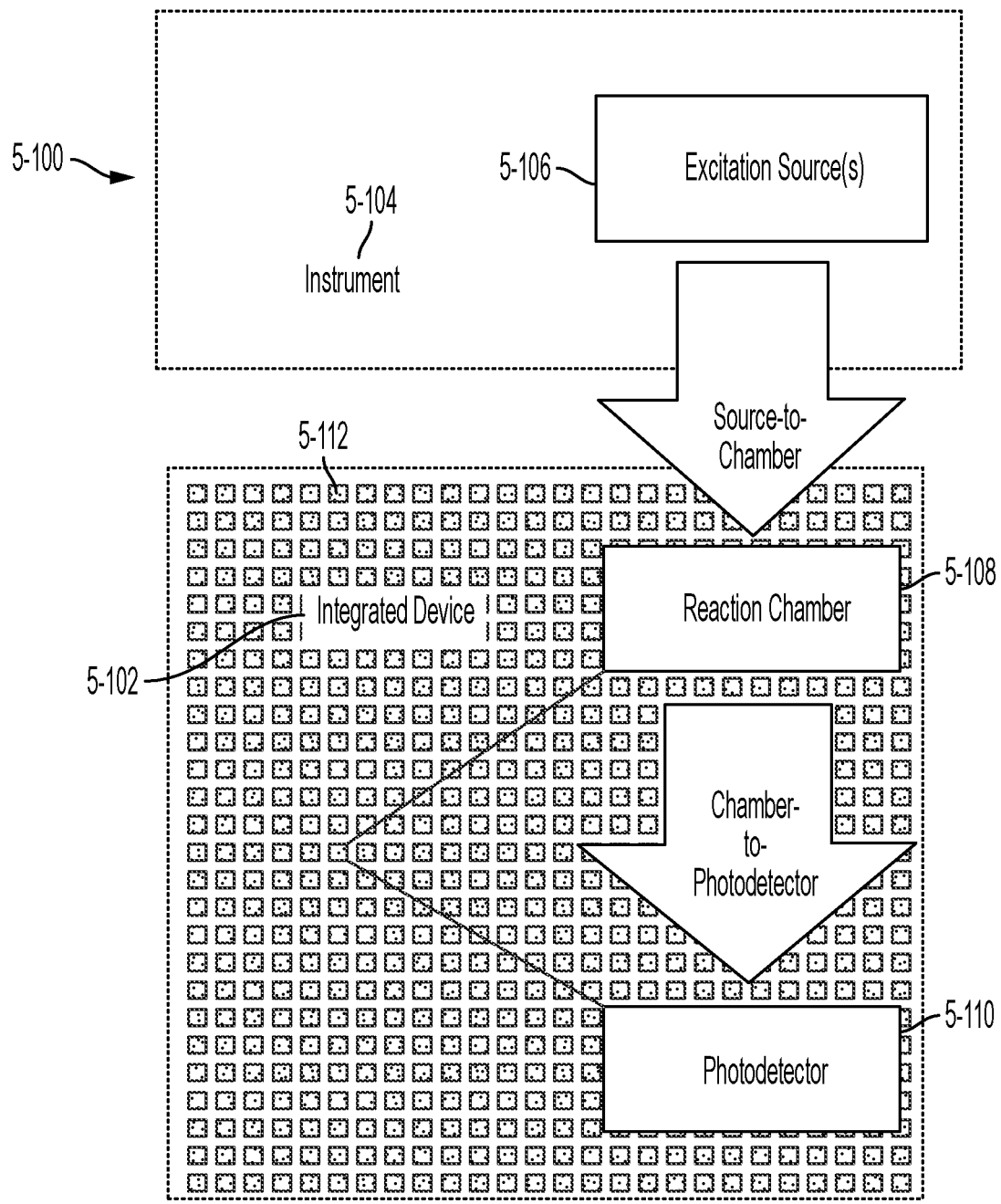
Figures 1B, 5:
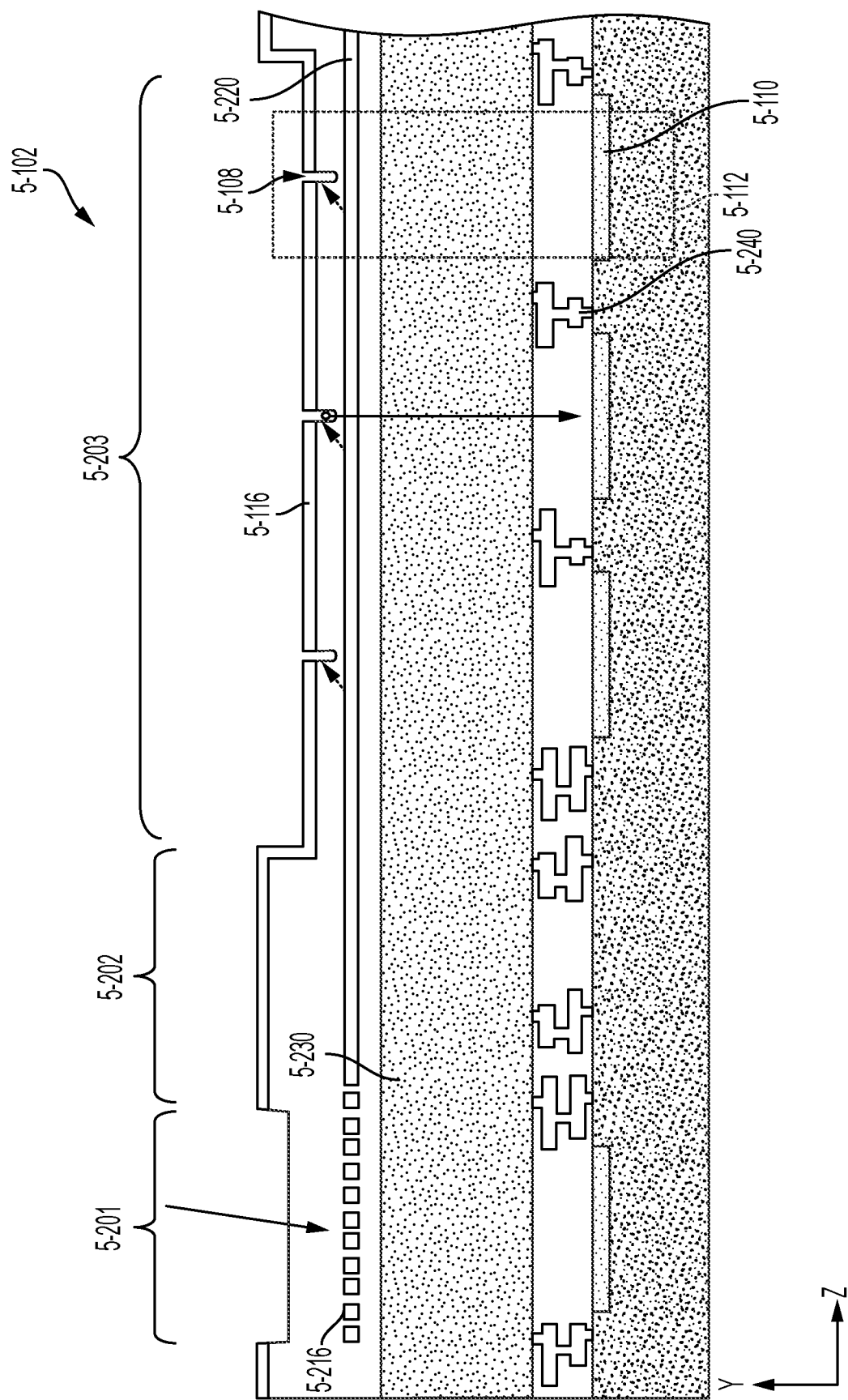
Figures 1C, 5:
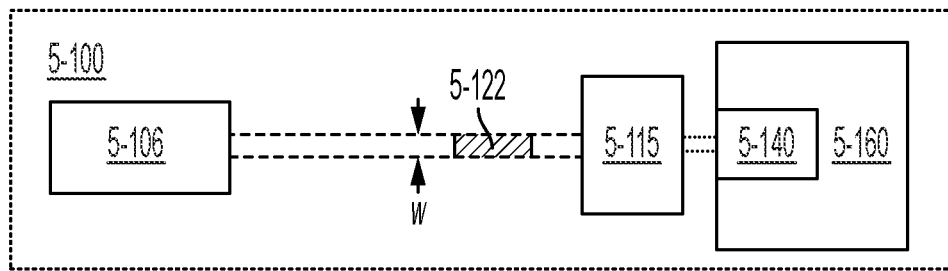
Figures 1D, 5:
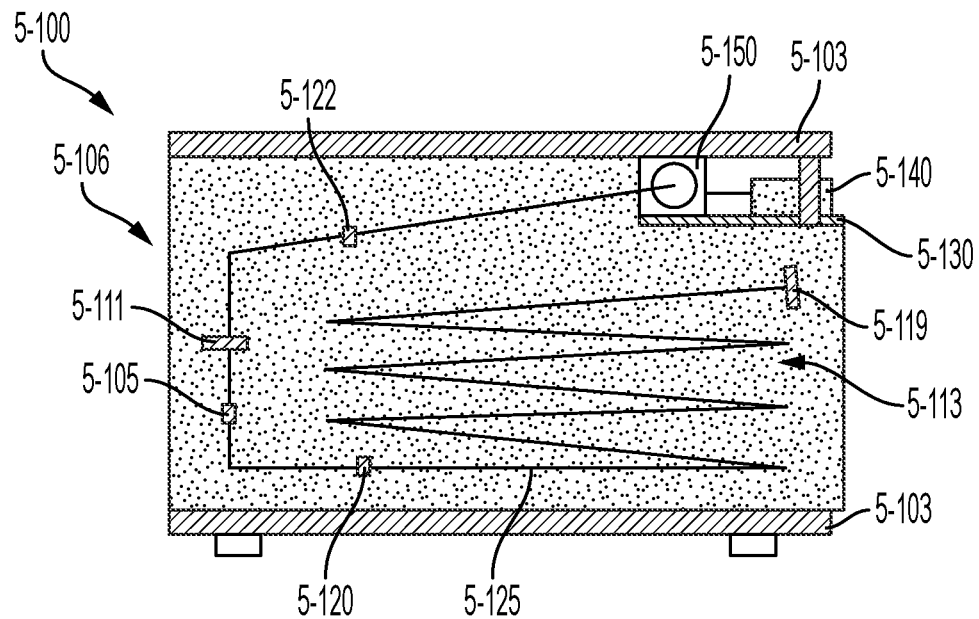
Figures 2, 5:
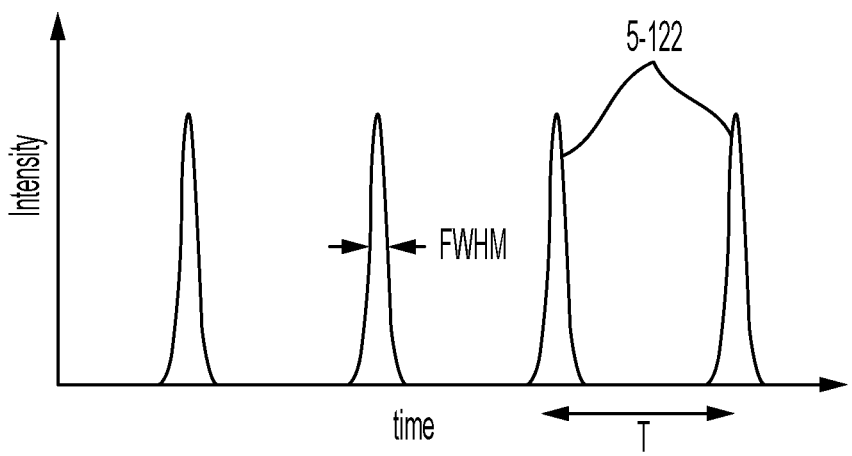
Figures 3, 5:
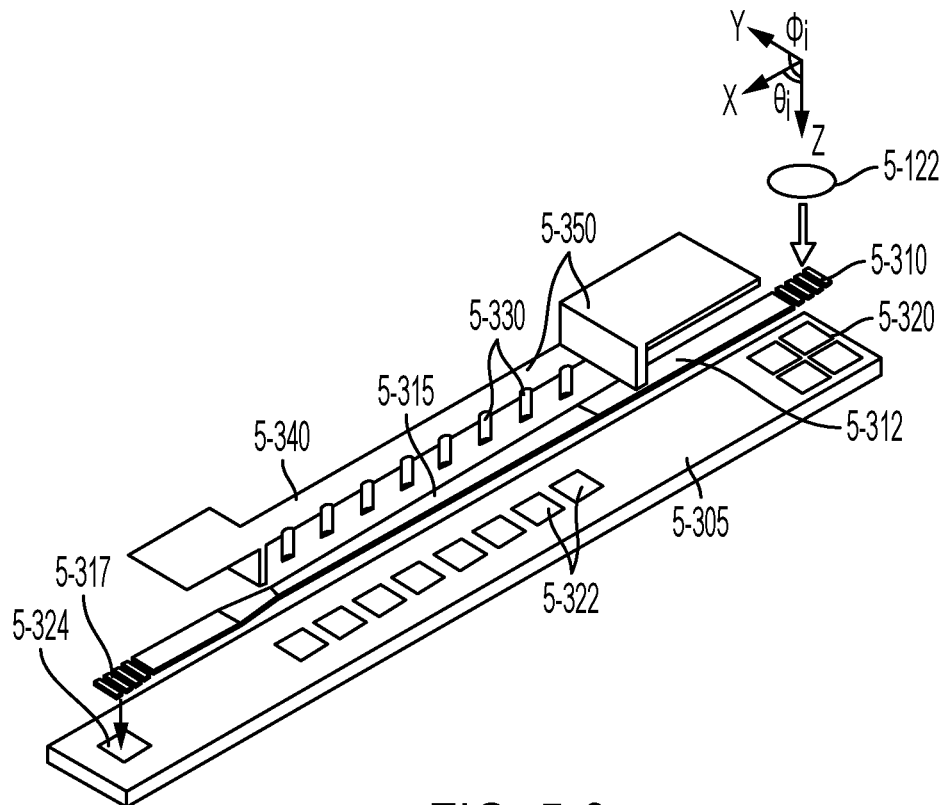
Figures 4, 5:
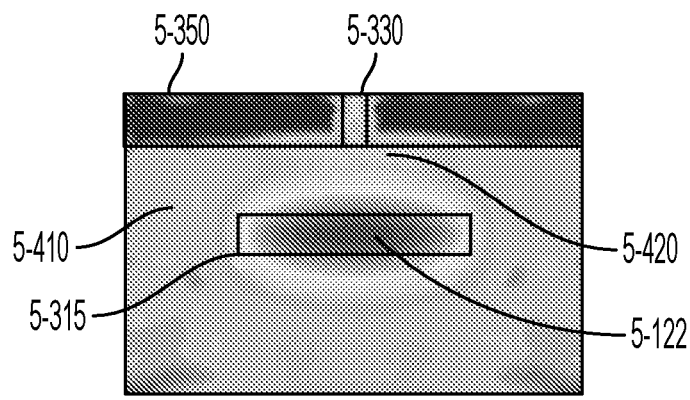
Figure 5:
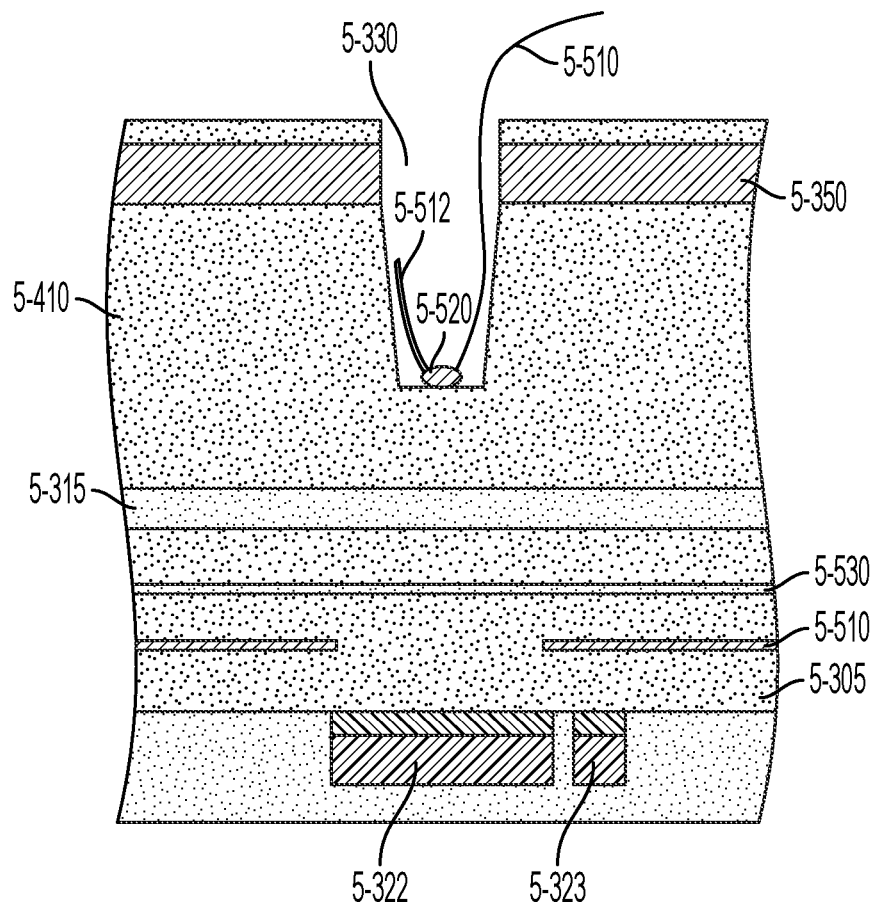
Figures 5, 6:
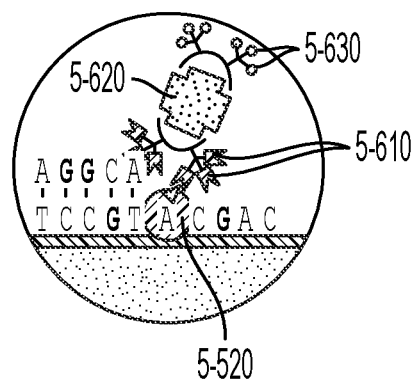

FIG. 5-1D depicts a further detailed example of a portable analytical instrument 5-100 that includes a compact pulsed optical source 5-108. In this example, the pulsed optical source 5-108 comprises a compact, passively mode-locked laser module 5-113. A passively mode-locked laser can produce optical pulses autonomously, without the application of an external pulsed signal. In some implementations, the module can be mounted to an instrument chassis or frame 5-103, and may be located inside an outer casing of the instrument. According to some embodiments, a pulsed optical source 5-106 can include additional components that can be used to operate the optical source and operate on an output beam from the optical source 5-106. A mode-locked laser 5-113 may comprise an element (e.g., saturable absorber, acousto-optic modulator, Kerr lens) in a laser cavity, or coupled to the laser cavity, that induces phase locking of the laser's longitudinal frequency modes. The laser cavity can be defined in part by cavity end mirrors 5-111, 5-119. Such locking of the frequency modes results in pulsed operation of the laser (e.g., an intracavity pulse 5-120 bounces back-and-forth between the cavity end mirrors) and produces a stream of output optical pulses 5-122 from one end mirror 5-111 which is partially transmitting.

In some cases, the analytic instrument 5-100 is configured to receive a removable, packaged, bio-optoelectronic or optoelectronic chip 5-140 (also referred to as a "disposable chip"). The disposable chip can include a bio-optoelectronic chip, for example, that comprises a plurality of reaction chambers, integrated optical components arranged to deliver optical excitation energy to the reaction chambers, and integrated photodetectors arranged to detect fluorescent emission from the reaction chambers. In some implementations, the chip 5-140 can be disposable after a single use, whereas in other implementations the chip 5-140 can be reused two or more times. When the chip 5-140 is received by the instrument 5-100, it can be in electrical and optical communication with the pulsed optical source 5-106 and with apparatus in the analytic system 5-160. Electrical communication may be made through electrical contacts on the chip package, for example.

In some embodiments and referring to FIG. 5-1D, the disposable chip 5-140 can be mounted (e.g., via a socket connection) on an electronic circuit board 5-130, such as a printed circuit board (PCB) that can include additional instrument electronics. For example, the PCB 5-130 can include circuitry configured to provide electrical power, one or more clock signals, and control signals to the optoelectronic chip 5-140, and signal-processing circuitry arranged to receive signals representative of fluorescent emission detected from the reaction chambers. Data returned from the optoelectronic chip can be processed in part or entirely by electronics on the instrument 5-100, although data may be transmitted via a network connection to one or more remote data processors, in some implementations. The PCB 5-130 can also include circuitry configured to receive feedback signals from the chip relating to optical coupling and power levels of the optical pulses 5-122 coupled into waveguides of the optoelectronic chip 5-140. The feedback signals can be provided to one or both of the pulsed optical source 5-106 and optical system 5-115 to control one or more parameters of the output beam of optical pulses 5-122. In some cases, the PCB 5-130 can provide or route power to the pulsed optical source 5-106 for operating the optical source and related circuitry in the optical source 5-106.

According to some embodiments, the pulsed optical source 5-106 comprises a compact mode-locked laser module 5-113. The mode-locked laser can comprise a gain medium 5-105 (which can be solid-state material in some embodiments), an output coupler 5-111, and a laser-cavity end mirror 5-119. The mode-locked laser's optical cavity can be bound by the output coupler 5-111 and end mirror 5-119. An optical axis 5-125 of the laser cavity can have one or more folds (turns) to increase the length of the laser cavity and provide a desired pulse repetition rate. The pulse repetition rate is determined by the length of the laser cavity (e.g., the time for an optical pulse to make a round-trip within the laser cavity).

In some embodiments, there can be additional optical elements (not shown in FIG. 5-1D) in the laser cavity for beam shaping, wavelength selection, and/or pulse forming. In some cases, the end mirror 5-119 comprises a saturable-absorber mirror (SAM) that induces passive mode locking of longitudinal cavity modes and results in pulsed operation of the mode-locked laser. The mode-locked laser module 5-113 can further include a pump source (e.g., a laser diode, not shown in FIG. 5-1D) for exciting the gain medium 5-105. Further details of a mode-locked laser module 5-113 can be found in U.S. patent application Ser. No. 15/844,469, titled "Compact Mode-Locked Laser Module," filed Dec. 15, 2017, each application of which is incorporated herein by reference.

When the laser 5-113 is mode locked, an intracavity pulse 5-120 can circulate between the end mirror 5-119 and the output coupler 5-111, and a portion of the intracavity pulse can be transmitted through the output coupler 5-111 as an output pulse 5-122. Accordingly, a train of output pulses 5-122, as depicted in the graph of FIG. 5-2, can be detected at the output coupler as the intracavity pulse 5-120 bounces back-and-forth between the output coupler 5-111 and end mirror 5-119 in the laser cavity.

FIG. 5-2 depicts temporal intensity profiles of the output pulses 5-122, though the illustration is not to scale. In some embodiments, the peak intensity values of the emitted pulses may be approximately equal, and the profiles may have a Gaussian temporal profile, though other profiles such as a sech2 profile may be possible. In some cases, the pulses may not have symmetric temporal profiles and may have other temporal shapes. The duration of each pulse may be characterized by a full-width-half-maximum (FWHM) value, as indicated in FIG. 5-2. According to some embodiments of a mode-locked laser, ultrashort optical pulses can have FWHM values less than 100 picoseconds (ps). In some cases, the FWHM values can be between approximately 5 ps and approximately 30 ps.

The output pulses 5-122 can be separated by regular intervals T. For example, T can be determined by a round-trip travel time between the output coupler 5-111 and cavity end mirror 5-119. According to some embodiments, the pulse-separation interval T can be between about 1 ns and about 30 ns. In some cases, the pulse-separation interval T can be between about 5 ns and about 20 ns, corresponding to a laser-cavity length (an approximate length of the optical axis 5-125 within the laser cavity) between about 0.7 meter and about 3 meters. In embodiments, the pulse-separation interval corresponds to a round trip travel time in the laser cavity, so that a cavity length of 3 meters (round-trip distance of 6 meters) provides a pulse-separation interval T of approximately 20 ns.

According to some embodiments, a desired pulse-separation interval T and laser-cavity length can be determined by a combination of the number of reaction chambers on the chip 5-140, fluorescent emission characteristics, and the speed of data-handling circuitry for reading data from the optoelectronic chip 5-140. In embodiments, different fluorophores can be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of reaction chambers. Pulse-separation interval T between about 5 ns and about 20 ns is suitable for fluorophores that have decay rates up to about 2 ns and for handling data from between about 60,000 and 10,000,000 reaction chambers.

According to some implementations, a beam-steering module 5-150 can receive output pulses from the pulsed optical source 5-106 and is configured to adjust at least the position and incident angles of the optical pulses onto an optical coupler (e.g., grating coupler) of the optoelectronic chip 5-140. In some cases, the output pulses 5-122 from the pulsed optical source 5-106 can be operated on by a beam-steering module 5-150 to additionally or alternatively change a beam shape and/or beam rotation at an optical coupler on the optoelectronic chip 5-140. In some implementations, the beam-steering module 5-150 can further provide focusing and/or polarization adjustments of the beam of output pulses onto the optical coupler. One example of a beam-steering module is described in U.S. patent application Ser. No. 15/161,088 titled "Pulsed Laser and Bioanalytic System," filed May 20, 2016, which is incorporated herein by reference. Another example of a beam-steering module is described in a separate U.S. patent application Ser. No. 62/435,679, filed Dec. 16, 2016, and titled "Compact Beam Shaping and Steering Assembly," which is incorporated herein by reference.

Referring to FIG. 5-3, the output pulses 5-122 from a pulsed optical source can be coupled into one or more optical waveguides 5-312 on a bio-optoelectronic chip 5-140, for example. In some embodiments, the optical pulses can be coupled to one or more waveguides via a grating coupler 5-310, though coupling to an end of one or more optical waveguides on the optoelectronic chip can be used in some embodiments. According to some embodiments, a quad detector 5-320 can be located on a semiconductor substrate 5-305 (e.g., a silicon substrate) for aiding in alignment of the beam of optical pulses 5-122 to a grating coupler 5-310. The one or more waveguides 5-312 and reaction chambers or reaction chambers 5-330 can be integrated on the same semiconductor substrate with intervening dielectric layers (e.g., silicon dioxide layers) between the substrate, waveguide, reaction chambers, and photodetectors 5-322.

Each waveguide 5-312 can include a tapered portion 5-315 below the reaction chambers 5-330 to equalize optical power coupled to the reaction chambers along the waveguide. The reducing taper can force more optical energy outside the waveguide's core, increasing coupling to the reaction chambers and compensating for optical losses along the waveguide, including losses for light coupling into the reaction chambers. A second grating coupler 5-317 can be located at an end of each waveguide to direct optical energy to an integrated photodiode 5-324. The integrated photodiode can detect an amount of power coupled down a waveguide and provide a detected signal to feedback circuitry that controls the beam-steering module 5-150, for example.

The reaction chambers 5-330 can be aligned with the tapered portion 5-315 of the waveguide and recessed in a tub 5-340. There can be photodetectors 5-322 located on the semiconductor substrate 5-305 for each reaction chamber 5-330. In some embodiments, a semiconductor absorber (shown in FIG. 5-5 as an optical filter 5-530) may be located between the waveguide and a photodetector 5-322 at each pixel. A metal coating and/or multilayer coating 5-350 can be formed around the reaction chambers and above the waveguide to prevent optical excitation of fluorophores that are not in the reaction chambers (e.g., dispersed in a solution above the reaction chambers). The metal coating and/or multilayer coating 5-350 may be raised beyond edges of the tub 5-340 to reduce absorptive losses of the optical energy in the waveguide 5-312 at the input and output ends of each waveguide.

There can be a plurality of rows of waveguides, reaction chambers, and time-binning photodetectors on the optoelectronic chip 5-140. For example, there can be 128 rows, each having 512 reaction chambers, for a total of 65,536 reaction chambers in some implementations. Other implementations may include fewer or more reaction chambers, and may include other layout configurations. Optical power from the pulsed optical source 5-106 can be distributed to the multiple waveguides via one or more star couplers or multimode interference couplers, or by any other means, located between an optical coupler 5-310 to the chip 5-140 and the plurality of waveguides 5-312.

FIG. 5-4 illustrates optical energy coupling from an optical pulse 5-122 within a tapered portion of waveguide 5-315 to a reaction chamber 5-330. The drawing has been produced from an electromagnetic field simulation of the optical wave that accounts for waveguide dimensions, reaction chamber dimensions, the different materials' optical properties, and the distance of the tapered portion of waveguide 5-315 from the reaction chamber 5-330. The waveguide can be formed from silicon nitride in a surrounding medium 5-410 of silicon dioxide, for example. The waveguide, surrounding medium, and reaction chamber can be formed by microfabrication processes described in U.S. application Ser. No. 14/821,688, filed Aug. 7, 2015, titled "Integrated Device for Probing, Detecting and Analyzing Molecules." According to some embodiments, an evanescent optical field 5-420 couples optical energy transported by the waveguide to the reaction chamber 5-330.

A non-limiting example of a biological reaction taking place in a reaction chamber 5-330 is depicted in FIG. 5-5. The example depicts sequential incorporation of nucleotides or nucleotide analogs into a growing strand that is complementary to a target nucleic acid. The sequential incorporation can take place in a reaction chamber 5-330, and can be detected by an advanced analytic instrument to sequence DNA. The reaction chamber can have a depth between about 150 nm and about 250 nm and a diameter between about 80 nm and about 160 nm. A metallization layer 5-540 (e.g., a metallization for an electrical reference potential) can be patterned above a photodetector 5-322 to provide an aperture or iris that blocks stray light from adjacent reaction chambers and other unwanted light sources. According to some embodiments, polymerase 5-520 can be located within the reaction chamber 5-330 (e.g., attached to a base of the chamber). The polymerase can take up a target nucleic acid 5-510 (e.g., a portion of nucleic acid derived from DNA), and sequence a growing strand of complementary nucleic acid to produce a growing strand of DNA 5-512. Nucleotides or nucleotide analogs labeled with different fluorophores can be dispersed in a solution above and within the reaction chamber.

Figures 1, 2, 3, 4, 5, 6:
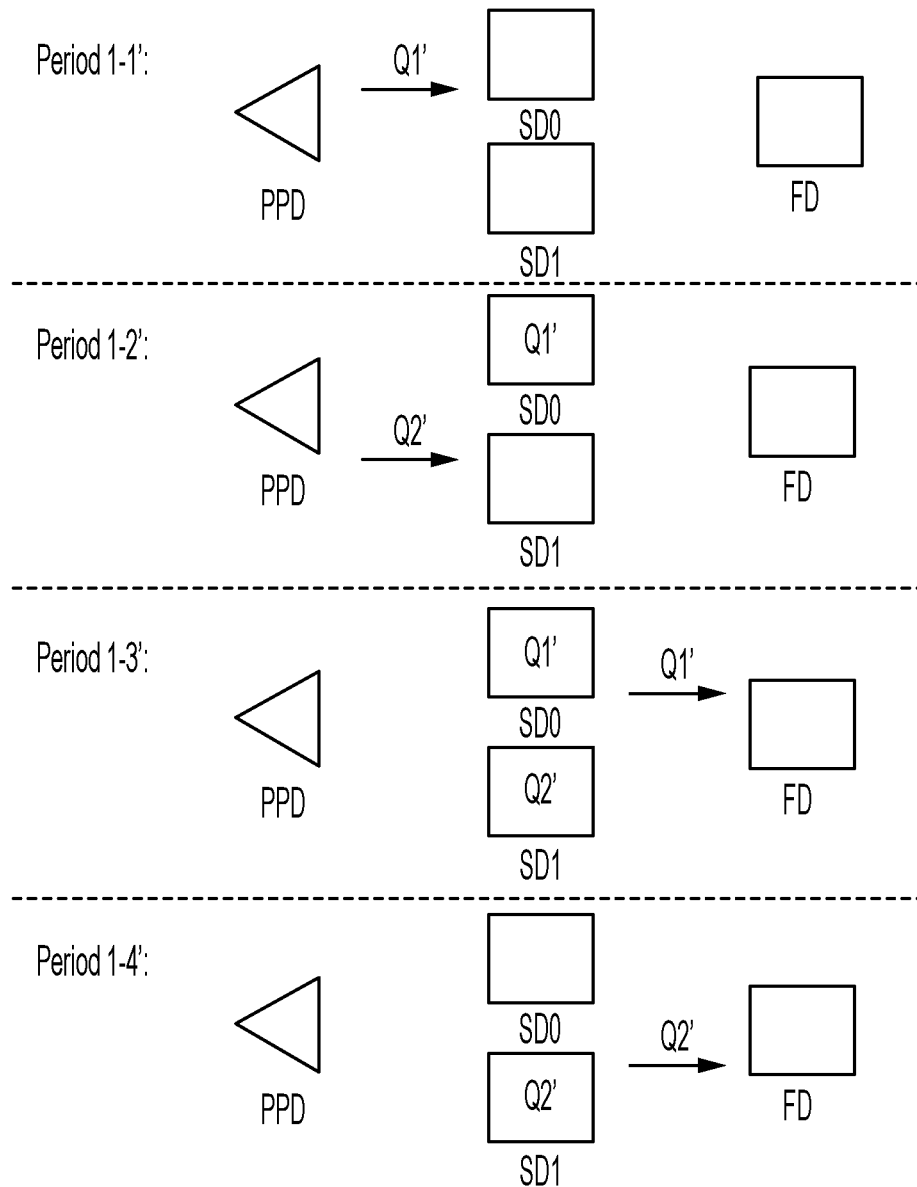

When a labeled nucleotide or nucleotide analog 5-610 is incorporated into a growing strand of complementary nucleic acid, as depicted in FIG. 5-6, one or more attached fluorophores 5-630 can be repeatedly excited by pulses of optical energy coupled into the reaction chamber 5-330 from the waveguide 5-315. In some embodiments, the fluorophore or fluorophores 5-630 can be attached to one or more nucleotides or nucleotide analogs 5-610 with any suitable linker 5-620. An incorporation event may last for a period of time up to about 100 ms. During this time, pulses of fluorescent emission resulting from excitation of the fluorophore(s) by pulses from the mode-locked laser can be detected with a time-binning photodetector 5-322, for example. In some embodiments, there can be one or more additional integrated electronic devices 5-323 at each pixel for signal handling (e.g., amplification, readout, routing, signal preprocessing, etc.). According to some embodiments, each pixel can include at least one optical filter 5-530 (e.g., a semiconductor absorber) that passes fluorescent emission and reduces transmission of radiation from the excitation pulse. Some implementations may not use the optical filter 5-530. By attaching fluorophores with different emission characteristics (e.g., fluorescent decay rates, intensity, fluorescent wavelength) to the different nucleotides (A,C,G,T), detecting and distinguishing the different emission characteristics while the strand of DNA 5-512 incorporates a nucleic acid and enables determination of the genetic sequence of the growing strand of DNA.

Figures 5, 6, 7:
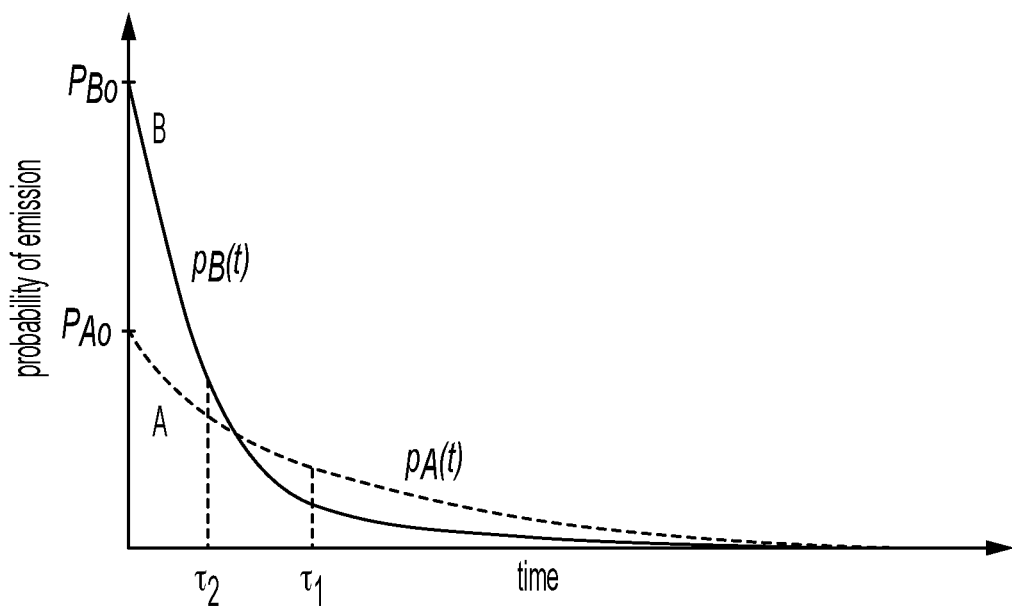
Figures 5, 6, 7, 8:
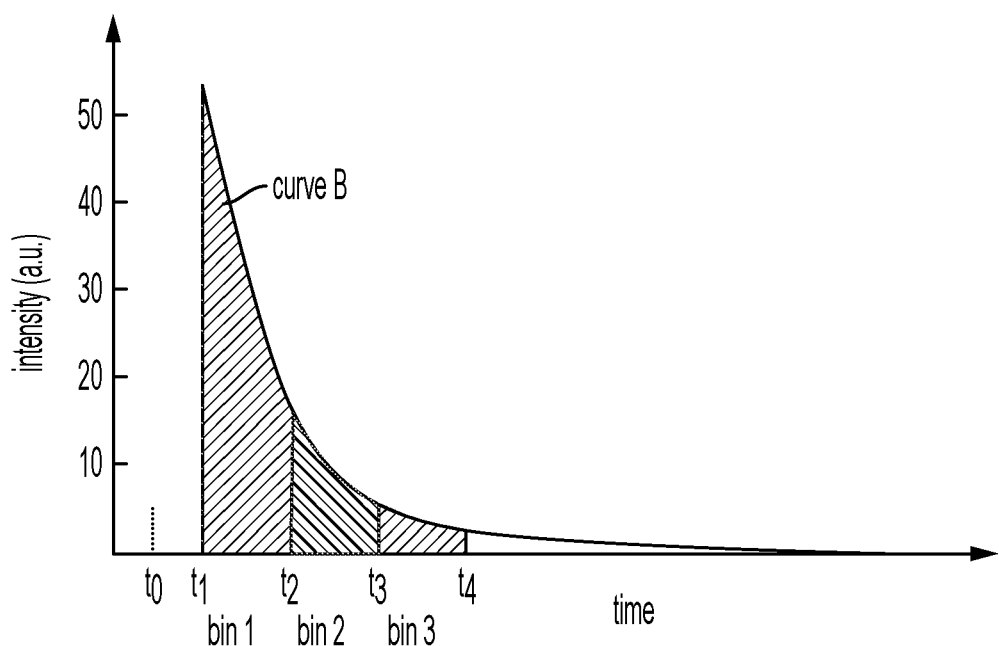
Figures 5, 6, 7, 8, 9:
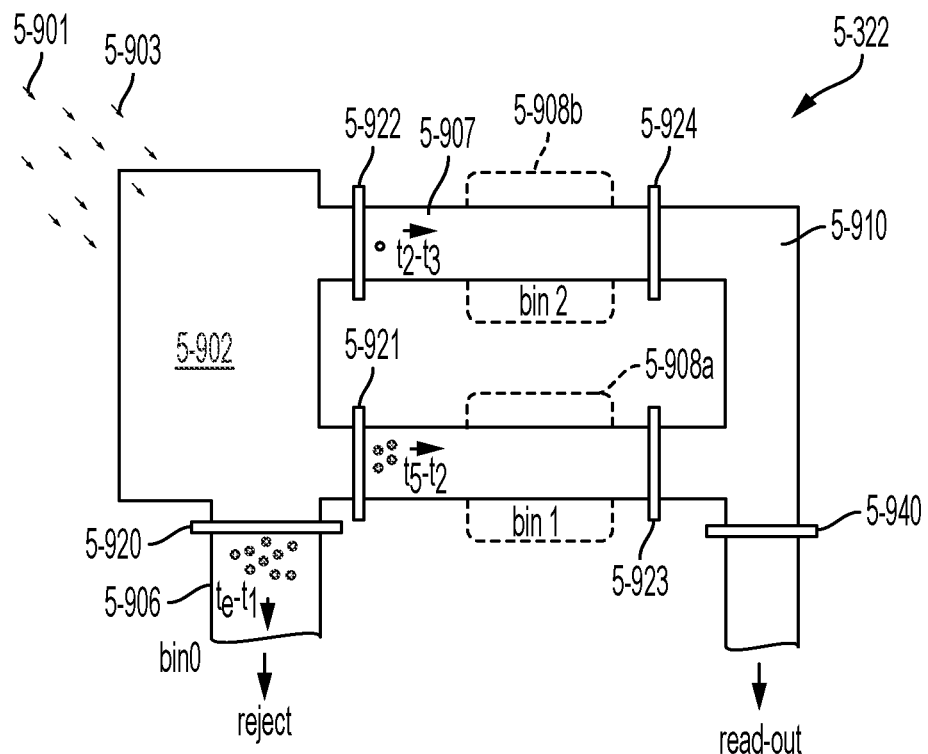
Figures 5, 6, 7, 8, 9, 10, 10A:
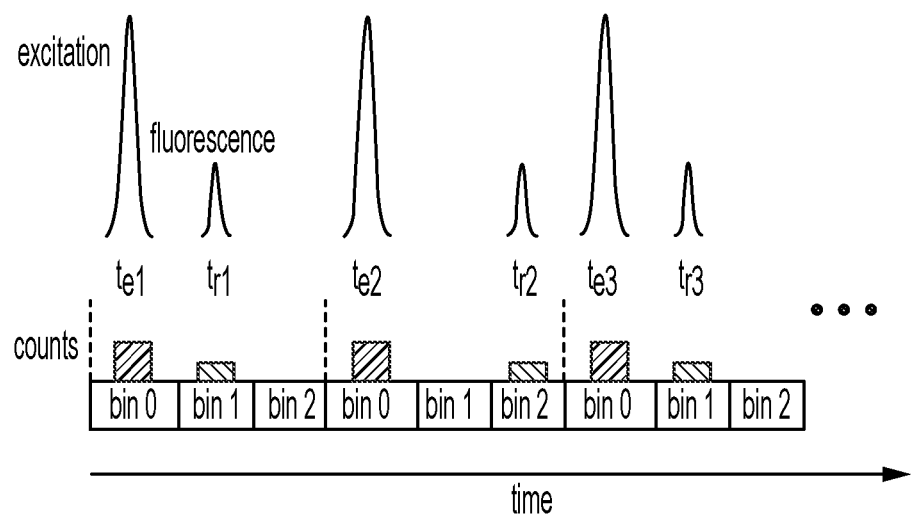
Figures 5, 6, 7, 8, 9, 10, 10B:
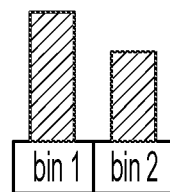
Figures 5, 6, 7, 8, 9, 10, 11, 11A:
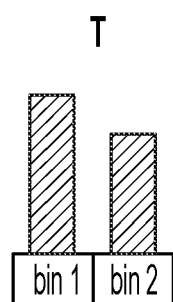
Figures 5, 6, 7, 8, 9, 10, 11, 11B:
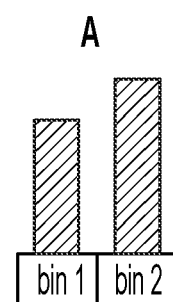
Figures 5, 6, 7, 8, 9, 10, 11, 11C:
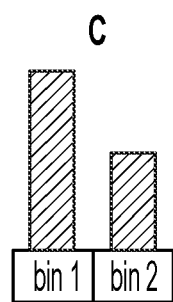
Figures 5, 6, 7, 8, 9, 10, 11, 11D:
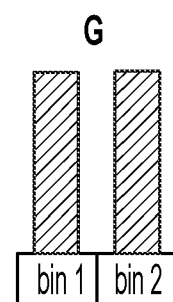
Figures 5, 6, 7, 8, 9, 10, 11, 12:
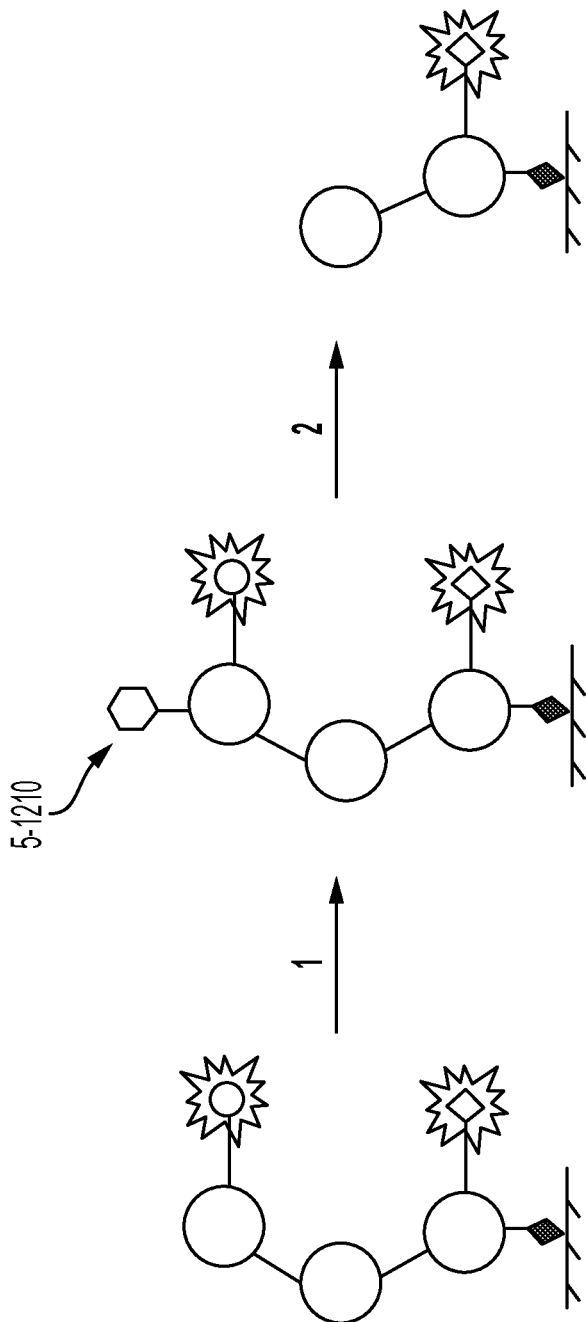
Figures 5, 6, 7, 8, 9, 10, 11, 12, 13:
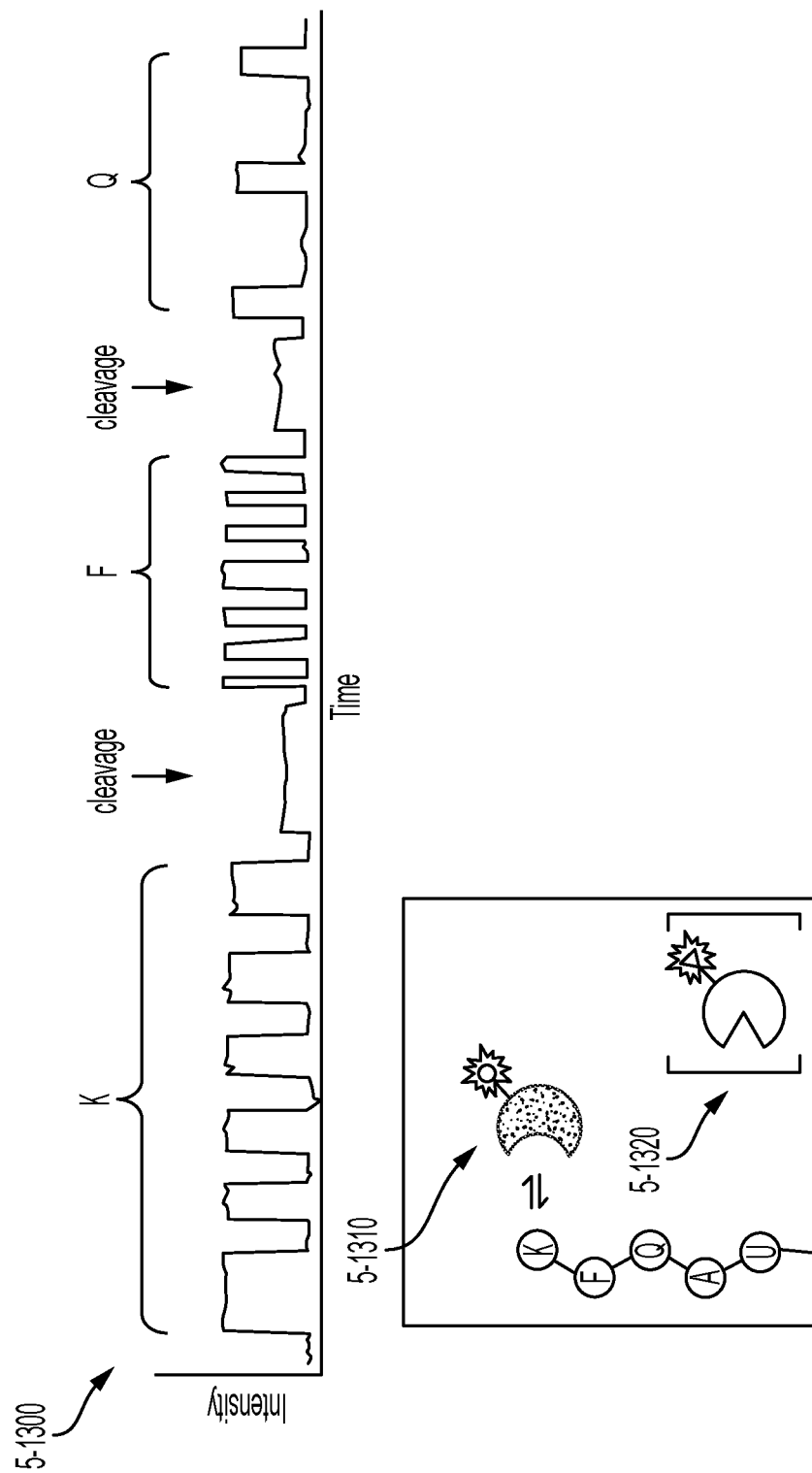

According to some embodiments, an advanced analytic instrument 5-100 that is configured to analyze samples based on fluorescent emission characteristics can detect differences in fluorescent lifetimes and/or intensities between different fluorescent molecules, and/or differences between lifetimes and/or intensities of the same fluorescent molecules in different environments. By way of explanation, FIG. 5-7 plots two different fluorescent emission probability curves (A and B), which can be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time can be represented by an exponential decay function $p\_A(t) = P\_Ao\, e^{(-t/\tau\_1)}$, where $P_{Ao}$ is an initial emission probability and $\tau\_1$ is a temporal parameter associated with the first fluorescent molecule that characterizes the emission decay probability. $\tau\_1$ may be referred to as the "fluorescence lifetime," "emission lifetime," or "lifetime" of the first fluorescent molecule. In some cases, the value of $\tau\_1$ can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile $p_B(t)$ that is exponential, but has a measurably different lifetime $\tau\_2$, as depicted for curve B in FIG. 5-7. In the example shown, the lifetime for the second fluorescent molecule of curve B is shorter than the lifetime for curve A, and the probability of emission $p_B(t)$ is higher sooner after excitation of the second molecule than for curve A. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument 5-100. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems 5-160 can additionally be configured to discern one or more properties of a sample based on fluorescent wavelength and/or fluorescent intensity.

Referring again to FIG. 5-7, according to some embodiments, different fluorescent lifetimes can be distinguished with a photodetector that is configured to time-bin fluorescent emission events following excitation of a fluorescent molecule. The time binning can occur during a single collection sequence for the photodetector. A collection sequence is an interval between readout periods during which charge carriers are accumulated in charge storage regions of the time-binning photodetector. The concept of determining fluorescent lifetime by time-binning of emission events is introduced graphically in FIG. 5-8. At time $t_e$ just prior to $t_1$, a fluorescent molecule or ensemble of fluorescent molecules of a same type (e.g., the type corresponding to curve B of FIG. 5-7) is (are) excited by a short or ultrashort optical pulse. For a large ensemble of molecules, the intensity of emission can have a time profile similar to curve B, as depicted in FIG. 5-8.

For a single molecule or a small number of molecules, however, the emission of fluorescent photons occurs according to the statistics of curve B in FIG. 5-7, for this example. A time-binning photodetector 5-322 can accumulate charge carriers generated from emission events into charge storage regions. Three charge storage regions are indicated in FIG. 5-8, though fewer charge storage regions or more charge storage regions may be used in embodiments. The charge storage regions may be temporally resolved with respect to the excitation time $t_e$ of the fluorescent molecule(s). For example, a first charge storage region (e.g., SD0) can accumulate charge carriers produced during an interval between times $t_1$ and $t_2$, occurring after the excitation event at time $t_e$. A second charge storage region (e.g., SD1) can accumulate carriers produced during an interval between times $t_2$ and $t_3$, and a third charge storage region (e.g., SD2) can accumulate carriers produced during an interval between times $t_3$ and $t_4$. When a large number of emission events are summed, charge carriers accumulated in the charge storage regions can approximate the decaying intensity curve shown in FIG. 5-8, and the binned signals can be used to distinguish between different fluorescent molecules or different environments in which a fluorescent molecule is located.

Examples of a time-binning photodetector 5-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," which are both incorporated herein by reference in their entirety. For explanation purposes, a non-limiting embodiment of a time-binning photodetector is depicted in FIG. 5-9. A single time-binning photodetector 5-322 can comprise a photodetection region 5-902, a charge transfer channel 5-906, and a plurality of charge storage regions 5-908a, 5-908b all formed on a semiconductor substrate. Charge transfer channels 5-907 can connect between the photodetection region 5-902 and charge storage regions 5-908a, 5-908b. In the illustrated example, two charge storage regions are shown, but there may be more or fewer. There can be a readout channel 5-910 connected to the carrier-storage regions. The photodetection region 5-902, charge transfer channel 5-906, charge storage regions 5-908a, 5-908b, and readout channel 5-910 can be formed by doping the semiconductor locally and/or forming adjacent insulating regions to provide photodetection capability, confinement, and transport of carriers. A time-binning photodetector 5-322 can also include a plurality of transfer gates 5-920, 5-921, 5-922, 5-923, 5-924 formed on the substrate that are configured to generate electric fields in the device for transporting carriers through the device.

In operation, a portion of an excitation pulse 5-122 from a pulsed optical source 5-106 (e.g., a mode-locked laser) is delivered to a reaction chamber 5-330 over the time-binning photodetector 5-322. Initially, some excitation radiation photons 5-901 may arrive at the photodetection region 5-902 and produce carriers (shown as light-shaded circles). There can also be some fluorescent emission photons 5-903 that arrive with the excitation radiation photons 5-901 and produce corresponding charge carriers (shown as dark-shaded circles). Initially, the number of charge carriers produced by the excitation radiation can be too large compared to the number of charge carriers produced by the fluorescent emission. The initial charge carriers produced during a time interval $t_e$-$t_1$ can be rejected by gating them into a charge transfer channel 5-906 with a first transfer gate 5-920, for example.

At a later times mostly fluorescent emission photons 5-903 arrive at the photodetection region 5-902 and produce charge carriers (indicated a dark-shaded circles) that provide useful and detectable signal that is representative of fluorescent emission from the reaction chamber 5-330. According to some detection methods, a second transfer gate 5-921 and third transfer gate 5-923 can be gated at a later time to direct carriers produced at a later time (e.g., during a second time interval $t_1$-$t_2$) to a first charge storage region 5-908a. Subsequently, a fourth transfer gate 5-922 and fifth transfer gate 5-924 can be gated at a later time (e.g., during a third time interval $t_2$-$t_3$) to direct charge carriers to a second charge storage region 5-908b. Charge carrier accumulation can continue in this manner after excitation pulses for a large number of excitation pulses to accumulate an appreciable number of charge carriers and signal level in each charge storage region 5-908a, 5-908b. At a later time, the signal can be read out from the charge storage regions. In some implementations, the time intervals corresponding to each charge storage region are at the sub-nanosecond time scale, though longer time scales can be used in some embodiments (e.g., in embodiments where fluorophores have longer decay times).

The process of generating and time-binning charge carriers after an excitation event (e.g., excitation pulse from a pulsed optical source) can occur once after a single excitation pulse or be repeated multiple times after multiple excitation pulses during a single charge-accumulation cycle for the time-binning photodetector 5-322. After charge accumulation is complete, charge carriers can be read out of the charge storage regions via the readout channel 5-910. For example, an appropriate biasing sequence can be applied to transfer gates 5-923, 5-924 and at least to transfer gate 5-940 to remove carriers from the charge storage regions 5-908a, 5-908b. The charge accumulation and readout processes can occur in a massively parallel operation on the optoelectronic chip 5-140 resulting in frames of data.

Although the described example in connection with FIG. 5-9 includes multiple charge storage regions 5-908a, 5-908b, in some cases a single charge storage region may be used instead. For example, only charge storage region SD0 may be present in a time-binning photodetector 5-322. In such a case, a single charge storage region 5-908a can be operated in a variable time-gated manner to look at different time intervals after different excitation events. For example, after pulses in a first series of excitation pulses, transfer gates for the storage region 5-908a can be gated to collect carriers generated during a first time interval (e.g., during the second time interval $t_1$-$t_2$), and the accumulated signal can be read out after a first predetermined number of pulses. After pulses in a subsequent series of excitation pulses at the same reaction chamber, the same transfer gates for the charge storage region 5-908a can be gated to collect charge carriers generated during a different interval (e.g., during the third time interval $t_2$-$t_3$), and the accumulated signal can be read out after a second predetermined number of pulses. Charge carriers could be collected during later time intervals in a similar manner if needed. In this manner, signal levels corresponding to fluorescent emission during different time periods after arrival of an excitation pulse at a reaction chamber can be produced using a single charge storage region.

In some embodiments, charge carriers produced during the second and third time intervals may be collected and stored using charge storage regions. For example, charge carriers produced during the time interval $t_1$-$t_2$ may be collected in charge storage region SD0, and then charge carriers produced during the time interval $t_2$-$t_3$ may be collected in charge storage region SD1, after which the charge carriers collected during time interval $t_1$-$t_3$ may be read out from the respective charge storage regions to readout region FD. Alternatively or additionally, the charge carriers produced during time interval $t_2$-$t_3$ can be collected in charge storage region SD0 after the charge carriers collected during time interval $t_1$-$t_2$ have been read out from charge storage region SD0 to readout region FD.

Regardless of how charge accumulation is carried out for different time intervals after excitation, signals that are read out can provide a histogram of bins that are representative of the fluorescent emission decay characteristics, for example. An example process is illustrated in FIG. 5-10A and FIG. 5-10B, for which two charge storage regions are used to acquire fluorescent emission from the reaction chambers. The histogram's bins can indicate a number of photons detected during each time interval after excitation of the fluorophore(s) in a reaction chamber 5-330. In some embodiments, signals for the bins will be accumulated following a large number of excitation pulses, as depicted in FIG. 5-10A. The excitation pulses can occur at times $t_{e1}$, $t_{e2}$, $t_{e3}$, . . . $t_{eN}$ which are separated by the pulse interval time T. In some cases, there can be between 105 and 107 excitation pulses 5-122 (or portions thereof) applied to a reaction chamber during an accumulation of signals in the charge storage regions for a single event being observed in the reaction chamber (e.g., a single nucleotide incorporation event in DNA analysis). In some embodiments, one charge storage region (bin 0 or SD0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bin0 signal acquisition after each excitation pulse. In such cases, carriers produced by an excitation pulse can be rejected and dumped from the photodetection region 5-902 as described above in connection with FIG. 5-9.

In some implementations, only a single photon may be emitted from a fluorophore following an excitation event, as depicted in FIG. 5-10A. After a first excitation event at time $t_{e1}$, the emitted photon at time $t_{f1}$ may occur within a first time interval (e.g., between times $t_1$ and $t_2$), so that the resulting charge carriers are accumulated in the first charge storage region (contributes to bin 1). In a subsequent excitation event at time $t_{e2}$, the emitted photon at time $t_{f2}$ may occur within a second time interval (e.g., between times $t_2$ and $t_3$), so that the resulting charge signal contributes to bin 2. After a next excitation event at time $t_{e3}$, a photon may emit at a time $t_{f3}$ occurring within the first time interval.

In some implementations, there may not be a fluorescent photon emitted and/or detected after each excitation pulse received at a reaction chamber 5-330. In some cases, there can be as few as one fluorescent photon that is detected at a reaction chamber for every 10,000 excitation pulses delivered to the reaction chamber. One advantage of implementing a mode-locked laser 5-113 as the pulsed excitation source 5-106 is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and charge carrier accumulations, the charge storage regions of the time-binning photodetector 5-322 can be read out to provide a multi-valued signal (e.g., a histogram of two or more values, an N-dimensional vector, etc.) for a reaction chamber. The signal values for each bin can depend upon the decay rate of the fluorophore. For example and referring again to FIG. 5-8, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

To further aid in understanding the signal analysis, the accumulated, multi-bin values can be plotted as a histogram, as depicted in FIG. 5-10B for example, or can be recorded as a vector or location in N-dimensional space. Calibration runs can be performed separately to acquire calibration values for the multi-valued signals (e.g., calibration histograms) for four different fluorophores linked to the four nucleotides or nucleotide analogs. As an example, the calibration histograms may appear as depicted in FIG. 5-11A (fluorescent label associated with the T nucleotide), FIG. 5-11B (fluorescent label associated with the A nucleotide), FIG. 5-11C (fluorescent label associated with the C nucleotide), and FIG. 5-11D (fluorescent label associated with the G nucleotide). A comparison of the measured multi-valued signal (corresponding to the histogram of FIG. 5-10B) to the calibration multi-valued signals can determine the identity "T" (FIG. 5-11A) of the nucleotide or nucleotide analog being incorporated into the growing strand of DNA.

In some implementations, fluorescent intensity can be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 5-3) to measured excitation energy and/or other acquired signals, it can be possible to distinguish different fluorophores based on intensity levels.

In some embodiments, different numbers of fluorophores of the same type can be linked to different nucleotides or nucleotide analogs, so that the nucleotides can be identified based on fluorophore intensity. For example, two fluorophores can be linked to a first nucleotide (e.g., "C") or nucleotide analog and four or more fluorophores can be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

Distinguishing nucleotides or any other biological or chemical specimens based on fluorophore decay rates and/or fluorophore intensities enables a simplification of the optical excitation and detection systems in an analytical instrument 5-100. For example, optical excitation can be performed with a single-wavelength source (e.g., a source producing one characteristic wavelength rather than multiple sources or a source operating at multiple different characteristic wavelengths). Additionally, wavelength-discriminating optics and filters may not be needed in the detection system to distinguish between fluorophores of different wavelengths.

Also, a single photodetector can be used for each reaction chamber to detect emission from different fluorophores.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

Fluorophores having emission wavelengths in a range between about 560 nm and about 900 nm can provide adequate amounts of fluorescence to be detected by a time-binning photodetector (which can be fabricated on a silicon wafer using CMOS processes). These fluorophores can be linked to biological molecules of interest, such as nucleotides or nucleotide analogs for genetic sequencing applications. Fluorescent emission in this wavelength range can be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. In some implementations, fluorophores having emission wavelengths in a range between about 560 nm and about 660 nm can be optically excited with a single-wavelength source. An example fluorophore in this range is Alexa Fluor 647, available from Thermo Fisher Scientific Inc. of Waltham, Massachusetts Excitation energy at shorter wavelengths (e.g., between about 500 nm and about 650 nm) may be used to excite fluorophores that emit at wavelengths between about 560 nm and about 900 nm. In some embodiments, the time-binning photodetectors can efficiently detect longer-wavelength emission from the reaction chambers, e.g., by incorporating other materials, such as Ge, into the photodetectors' active regions.

VII. Protein Sequencing Applications

Some aspects of the present disclosure may be useful for protein sequencing. For example, some aspects of the present disclosure are useful for determining amino acid sequence information from polypeptides (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Methods of selective labeling of amino acid side chains and details relating to the preparation and analysis of labeled polypeptides are known in the art (see, e.g., Swaminathan, et al. PLoS Comput Biol. 2015, 11(2):e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, some embodiments provide compositions and methods for sequencing a polypeptide by sequencing a plurality of fragments of the polypeptide. In some embodiments, sequencing a polypeptide comprises combining sequence information for a plurality of polypeptide fragments to identify and/or determine a sequence for the polypeptide. In some embodiments, combining sequence information may be performed by computer hardware and software. The methods described herein may allow for a set of related polypeptides, such as an entire proteome of an organism, to be sequenced. In some embodiments, a plurality of single molecule sequencing reactions may be performed in parallel (e.g., on a single chip). For example, in some embodiments, a plurality of single molecule sequencing reactions are each performed in separate sample wells on a single chip.

In some embodiments, methods provided herein may be used for the sequencing and identification of an individual protein in a sample comprising a complex mixture of proteins. Some embodiments provide methods of uniquely identifying an individual protein in a complex mixture of proteins. In some embodiments, an individual protein is detected in a mixed sample by determining a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. PLoS Comput Biol. 2015, 11(2):e1004080; and Yao, et al. Phys. Biol. 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is incorporated by reference in its entirety.

Sequencing in accordance with some embodiments can involve immobilizing a polypeptide on a surface of a substrate or solid support, such as a chip or integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage, for example as described herein. In some embodiments, a plurality of polypeptides are attached to a plurality of sample wells (e.g., with one polypeptide attached to a surface, for example a bottom surface, of each sample well), for example in an array of sample wells on a substrate.

Some aspects of the present disclosure provide a method of sequencing a polypeptide by detecting luminescence of a labeled polypeptide which is subjected to repeated cycles of terminal amino acid modification and cleavage. For example, FIG. 5-12 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 5-12 may be performed as described elsewhere herein for terminal amino acid modification and terminal amino acid cleavage, respectively, in an Edman degradation reaction.

As shown in the example depicted in FIG. 5-12, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 5-1210 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 5-12 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 5-13 shows an example of a method of sequencing in which discrete binding events give rise to signal pulses of a signal output 5-1300. The inset panel of FIG. 5-13 illustrates a general scheme of real-time sequencing by this approach. As shown, a labeled amino acid recognition molecule 5-1310 selectively binds to and dissociates from a terminal amino acid (shown here as lysine), which gives rise to a series of pulses in signal output 5-1300 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 5-1310 selectively binds according to a binding affinity (KD) defined by an association rate of binding (kon) and a dissociation rate of binding (koff). The rate constants koff and kon are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 5-1320 comprising a detectable label that is different than that of labeled amino acid recognition molecule 5-1310. In some embodiments, labeled cleaving reagent 5-1320 is present in the mixture at a concentration that is less than that of labeled amino acid recognition molecule 5-1310. In some embodiments, labeled cleaving reagent 5-1320 displays broad specificity such that it cleaves most or all types of terminal amino acids.

As illustrated by the progress of signal output 5-1300, in some embodiments, terminal amino acid cleavage by labeled cleaving reagent 5-1320 gives rise to a uniquely identifiable signal pulse, and these events occur with lower frequency than the binding pulses of a labeled amino acid recognition molecule 5-1310. In this way, amino acids of a polypeptide can be counted and/or identified in a real-time sequencing process. As further illustrated in signal output 5-1300, in some embodiments, a labeled amino acid recognition molecule 5-1310 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern which may be used to identify a corresponding terminal amino acid.

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An integrated circuit, comprising:
a first charge storage region;
a first transfer gate configured to control, in response to a control signal, a transfer of charge carriers to the first charge storage region,
wherein:
the first transfer gate is configured to receive, at a first time, the control signal; and
the control signal has, at the first transfer gate at the first time, a first voltage;
a second charge storage region; and
a second transfer gate configured to control, in response to the control signal, a transfer of charge carriers to the second charge storage region,
wherein:
the second transfer gate is configured to receive, substantially at the first time, the control signal; and
the control signal has, at the second transfer gate substantially at the first time, a second voltage different from the first voltage.

2. The integrated circuit of claim 1, further comprising:
a first photodetection region configured to generate charge carriers in response to receiving photons, wherein the first transfer gate is configured to control, in response to the control signal, a transfer of charge carriers from the first photodetection region to the first charge storage region; and
a second photodetection region configured to generate charge carriers in response to receiving photons, wherein the second transfer gate is configured to control, in response to the control signal, a transfer of charge carriers from the second photodetection region to the second charge storage region.

3. The integrated circuit of claim 2, further comprising:
a first pixel comprising the first photodetection region, the first charge storage region, and the first transfer gate; and
a second pixel comprising the second photodetection region, the second charge storage region, and the second transfer gate,
wherein the first and second pixels are positioned in a row of the integrated circuit.

4. The integrated circuit of claim 3, further comprising:
a third pixel positioned in the row of the integrated circuit, the third pixel comprising:
a third photodetection region configured to generate charge carriers in response to receiving photons;
a third charge storage region; and
a third transfer gate configured to control, in response to the control signal, a transfer of charge carriers from the third photodetection region to the third charge storage region, wherein:
the third transfer gate is configured to receive, substantially at the first time, the control signal; and
the control signal has, at the third transfer gate substantially at the first time, a third voltage different from the first and second voltages.

5. The integrated circuit of claim 2, further comprising:
a plurality of reaction chambers configured to receive a sample,
wherein the first and second photodetection regions are positioned to receive fluorescent photons from the sample.

6. A system, comprising:
the integrated circuit of claim 5;
an excitation light source; and
a control circuit configured to:
generate and provide the control signal to the first and second transfer gates; and
control the excitation light source to illuminate the sample with excitation light that excites the sample to emit the fluorescent photons.

7. The system of claim 6, wherein:
the integrated circuit further comprises a first drain region and a second drain region; and
the control circuit is further configured to control transfers of excitation charge carriers from the first photodetection region to the first drain region and from the second photodetection region to the second drain region, the excitation charge carriers generated in the first and second photodetection regions in response to receiving photons of the excitation light.

8. A method of operating an integrated circuit, the method comprising:
receiving, at a first transfer gate, at a first time, a control signal,
wherein the control signal has, at the first transfer gate at the first time, a first voltage;
controlling, using the first transfer gate, in response to the control signal, a transfer of charge carriers to a first charge storage region;
receiving, at a second transfer gate, substantially at the first time, the control signal,
wherein the control signal has, at the second transfer gate substantially at the first time, a second voltage different from the first voltage; and
controlling, using the second transfer gate, in response to the control signal, a transfer of charge carriers to a second charge storage region.

9. The method of claim 8, further comprising:
generating, in a first photodetection region, in response to receiving photons, charge carriers, wherein the controlling the transfer of charge carriers to the first charge storage region comprises controlling a transfer of charge carriers from the first photodetection region to the first charge storage region; and
generating, in a second photodetection region, in response to receiving photons, charge carriers, wherein controlling the transfer of charge carriers to the second charge storage region comprises controlling a transfer of charge carriers from the second photodetection region to the second charge storage region.

10. The method of claim 9, wherein:
a first pixel positioned in a row of an integrated circuit comprises the first photodetection region, the first charge storage region, and the first transfer gate; and
a second pixel positioned in the row of the integrated circuit comprises the second photodetection region, the second charge storage region, and the second transfer gate.

11. The method of claim 10, further comprising:
receiving, at a third transfer gate, substantially at the first time, the control signal,
wherein the control signal has, at the third transfer gate substantially at the first time, a third voltage level different from the first and second voltages;
generating, in a third photodetection region, in response to receiving photons, charge carriers; and
controlling, using the third transfer gate, in response to the control signal; a transfer of charge carriers from the third photodetection region to a third charge storage region,
wherein a third pixel positioned in the row of the integrated circuit comprises the third photodetection region, the third charge storage region, and the third transfer gate.

12. The method of claim 9, further comprising:
receiving, at the first and second photodetection regions, fluorescent photons from a sample,
wherein generating charge carriers in the first and second photodetection regions comprises generating at least some of the charge carriers in response to receiving the fluorescent photons.

13. The method of claim 12, further comprising:
controlling an excitation light source to illuminate the sample with excitation light that excites the sample to emit the fluorescent photons.

14. The method of claim 13, further comprising:
generating, in the first and second photodetection regions in response to receiving photons of the excitation light, excitation charge carriers; and
controlling transfers of excitation charge carriers from the first photodetection region to a first drain region and from the second photodetection region to a second drain region.

15. A system, comprising:
an integrated circuit, comprising:
a first charge storage region;
a first transfer gate configured to control, in response to a control signal, a transfer of charge carriers to the first charge storage region,
a second charge storage region; and
a second transfer gate configured to control, in response to the control signal, a transfer of charge carriers to the second charge storage region; and
a control circuit configured to provide the control signal to the first transfer gate at a first time and provide the control signal to the second transfer gate substantially at the first time,
wherein:
the control signal has, at the first transfer gate at the first time, a first voltage; and
the control signal has, at the second transfer gate substantially at the first time, a second voltage different from the first voltage.

16. The system of claim 15, wherein the integrated circuit further comprises:
a first photodetection region configured to generate charge carriers in response to receiving photons, wherein the first transfer gate is configured to control, in response to the control signal, a transfer of charge carriers from the first photodetection region to the first charge storage region; and
a second photodetection region configured to generate charge carriers in response to receiving photons, wherein the second transfer gate is configured to control, in response to the control signal, a transfer of charge carriers from the second photodetection region to the second charge storage region.

17. The system of claim 16, wherein the integrated circuit further comprises:
- a first pixel comprising the first photodetection region, the first charge storage region, and the first transfer gate; and
- a second pixel comprising the second photodetection region, the second charge storage region, and the second transfer gate,
- wherein the first and second pixels are positioned in a row of the integrated circuit.

18. The system of claim 17, wherein:
- the integrated circuit further comprises a third pixel positioned in the row of the integrated circuit, the third pixel comprising:
  - a third photodetection region configured to generate charge carriers in response to receiving photons;
  - a third charge storage region; and
  - a third transfer gate configured to control, in response to the control signal, a transfer of charge carriers from the third photodetection region to the third charge storage region; and
- the control circuit is further configured to provide the control signal to the third transfer gate substantially at the first time, the control signal having, at the third transfer gate substantially at the first time, a third voltage different from the first and second voltages.

19. The system of claim 16, further comprising:
- a plurality of reaction chambers configured to receive a sample,
- wherein the first and second photodetection regions are positioned to receive fluorescent photons from the sample.

20. The system of claim 19, further comprising:
- an excitation light source,
- wherein the control circuit is further configured to control the excitation light source to illuminate the sample with excitation light that excited the sample to emit the fluorescent photons.

21. The system of claim 20, wherein:
- the integrated circuit further comprises a first drain region and a second drain region; and
- the control circuit is further configured to control transfers of excitation charge carriers from the first photodetection region to the first drain region and from the second photodetection region to the second drain region, the excitation charge carriers generated in the first and second photodetection regions in response to receiving photons of the excitation light.

* * * * *